(12) United States Patent
Cheng

(10) Patent No.: US 11,728,413 B2
(45) Date of Patent: Aug. 15, 2023

(54) GATE CAPPING STRUCTURES IN SEMICONDUCTOR DEVICES

(71) Applicant: Taiwan Semiconductor Manufacturing Co., Ltd., Hsinchu (TW)

(72) Inventor: Chung-Liang Cheng, Changhua County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/244,428

(22) Filed: Apr. 29, 2021

(65) Prior Publication Data

US 2022/0037510 A1 Feb. 3, 2022

Related U.S. Application Data

(60) Provisional application No. 63/065,918, filed on Aug. 14, 2020, provisional application No. 63/059,005, filed on Jul. 30, 2020.

(51) Int. Cl.
*H01L 29/66* (2006.01)
*H01L 29/78* (2006.01)
*H01L 21/8234* (2006.01)

(52) U.S. Cl.
CPC ......... *H01L 29/66795* (2013.01); *H01L 21/823418* (2013.01); *H01L 21/823431* (2013.01); *H01L 29/7851* (2013.01)

(58) Field of Classification Search
CPC ....... H01L 29/66795; H01L 21/823418; H01L 21/823431; H01L 29/7851; H01L 29/41791; H01L 21/76825; H01L 21/76843; H01L 21/76865; H01L 21/76895; H01L 21/76897; H01L 21/823475; H01L 29/785; H01L 21/823437; H01L 27/0886; H01L 21/823821; H01L 21/823871; H01L 27/0924; H01L 29/42312–42396; H01L 29/49–518; H01L 21/82345; H01L 21/82385; H01L 21/823842;
(Continued)

(56) References Cited

U.S. PATENT DOCUMENTS 9,105,490 B2   8/2015 Wang et al.
9,236,267 B2   1/2016 De et al.
(Continued)

*Primary Examiner* — Cuong B Nguyen
(74) *Attorney, Agent, or Firm* — Sterne, Kessler, Goldstein & Fox P.L.L.C.

(57) ABSTRACT

A semiconductor device and methods of fabricating the same are disclosed. The semiconductor device includes a substrate, a fin structure disposed on the substrate, a source/drain (S/D) region disposed on the fin structure, and a gate structure disposed on the fin structure adjacent to the S/D region. The gate structure includes a gate stack disposed on the fin structure and a gate capping structure disposed on the gate stack. The gate capping structure includes a conductive gate cap disposed on the gate stack and an insulating gate cap disposed on the conductive gate cap. The semiconductor device further includes a first contact structure disposed over the gate stack. A portion of the first contact structure is disposed within the gate capping structure and is separated from the gate stack by a portion of the conductive gate cap.

20 Claims, 36 Drawing Sheets

(58) Field of Classification Search
CPC ..... H01L 2924/13081–13085; H01L 27/1251; H01L 29/66484; H01L 29/66886; H01L 29/7855; H01L 29/78645; H01L 29/78648; H01L 51/0554; H01L 29/4958; H01L 29/7831–7832
See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2019/0115437 A1* | 4/2019 | Galatage .......... H01L 29/40114 |
| 2019/0139825 A1* | 5/2019 | You .................. H01L 21/31144 |
| 2019/0355663 A1* | 11/2019 | Nishikawa .......... H01L 23/5226 |
| 2020/0035796 A1 | 1/2020 | Lee et al. |
| 2020/0126843 A1 | 4/2020 | Tsai et al. |
| 2020/0126926 A1* | 4/2020 | Varghese .......... H01L 21/76847 |

* cited by examiner

GATE CAPPING STRUCTURES IN SEMICONDUCTOR DEVICES

CROSS-REFERENCE TO RELATED APPLICATIONS

This application claims the benefit of U.S. Provisional Patent Application No. 63/059,005, titled Semiconductor Device with Bi-Layer Cap and Method of Fabricating the same," filed Jul. 30, 2020, and claims the benefit of U.S. Provisional Patent Application No. 63/065,918, titled "Semiconductor Device with Bi-layer Cap and Method of Fabricating the same," filed Aug. 14, 2020, each of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures.

Figure 1A:
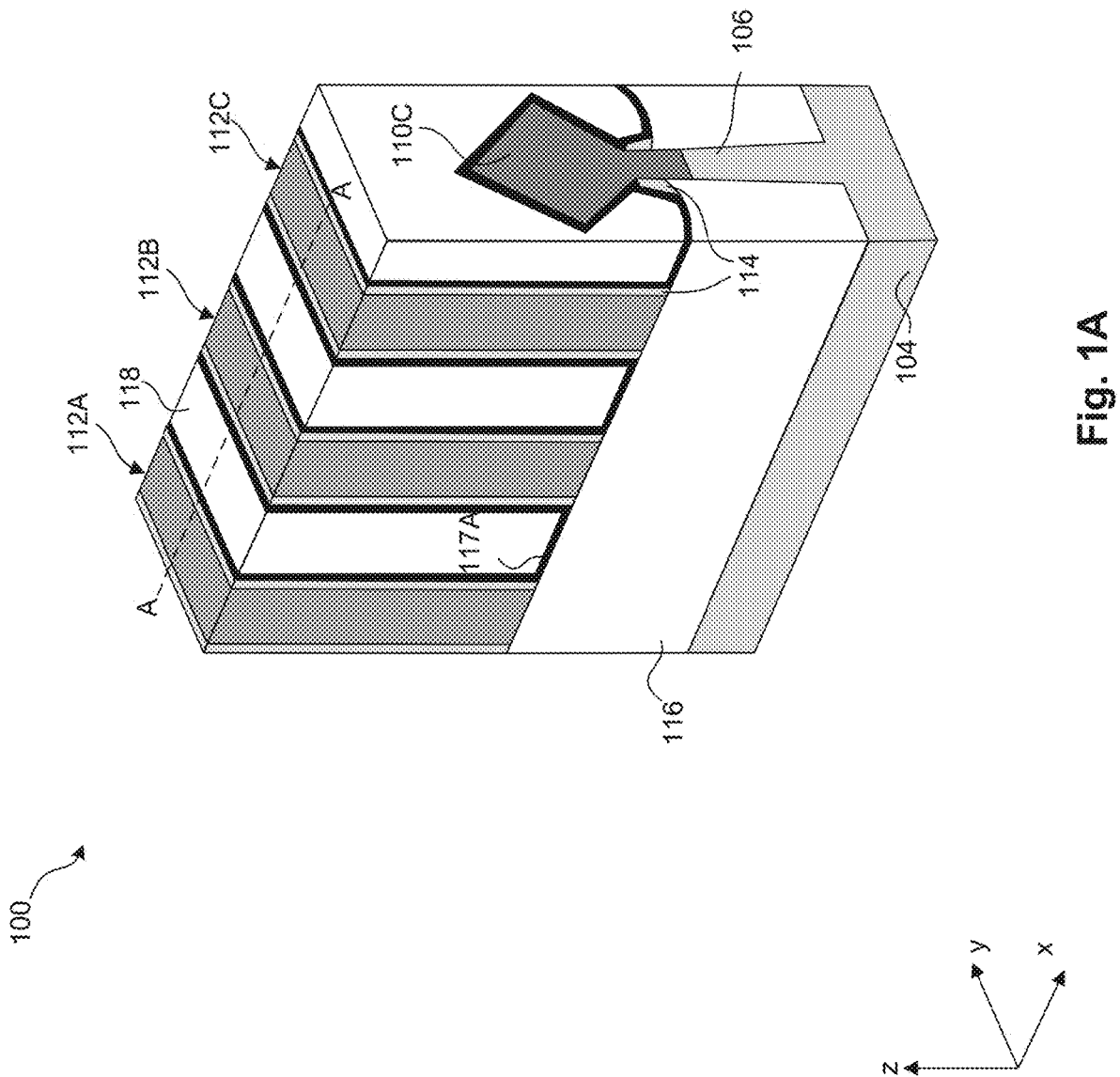
FIG. 1A illustrates an isometric view of a semiconductor device, in accordance with some embodiments.

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the embodiments and/or configurations discussed herein.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example semiconductor devices (e.g., finFETs, gate-all-around (GAA) FETs, and/or MOSFETs) with gate capping structures in gate structures. Further, the present disclosure provides example methods of forming such semiconductor devices with reduced contact resistance between the gate structures and gate contact structures, which are formed through the gate capping structures. The gate capping structures improve conductive interfaces between the gate structures and the gate contact structures, while protecting the integrity of the gate structures during the fabrication of the semiconductor devices.

In some embodiments, each of the gate structure can include a gate stack with a high-k gate dielectric layer, a work function metal (WFM) layer, an oxygen barrier layer, and a gate metal fill layer, and the gate capping structure disposed on the gate stack. In some embodiments, the gate capping structure can include a conductive gate cap disposed on the gate stack and an insulating gate cap disposed on the conductive gate cap. The conductive gate cap improves conductive interface between the gate stack and the gate contact structure to electrically connect the gate stack to the gate contact structure without forming the gate contact structure directly on or within the gate stack. The gate contact structure is not formed directly on or within the gate stack to prevent contamination of the gate stack by any of the processing materials used in the formation of the gate contact structure. Contamination of the gate stack can lead to the degradation of device performance. Thus, with the use of the conductive gate cap, the gate stack can be electrically connected to the gate contact structure without compromising the integrity of the gate structure.

In some embodiments, the insulating gate cap protects the underlying conductive gate cap and the gate stack from structural and/or compositional degradation during subsequent processing of the semiconductor device. In some embodiments, the conductive gate cap can include a growth promotion layer (GPL) disposed on the gate stack and an etch stop layer (ESL) disposed on the GPL. The GPL and ESL can include conductive materials different from each other. The GPL provides a surface favorable for the bottom up deposition of the ESL in addition to providing the conductive interface between the gate stack and the gate contact structure. Without the GPL, the ESL may not selectively deposit on the gate stack and may deposit on FET structures that can electrically short with subsequently-formed adjacent structures, such as source/drain (S/D) contact structures. The GPL can include a material for which the ESL has a deposition selectivity that is higher than the deposition selectivity for one or more of the materials (e.g., dielectric materials of the high-k gate dielectric layer and oxygen barrier layer) of the gate stack. In other words, the ESL can deposit at a higher rate on the GPL than on the gate stack. The ESL controls the depth profile of the gate contact structure and prevents the gate contact structure from extending into the gate stack in addition to providing the conductive interface between the gate stack and the gate contact structure.

FIG. 1A illustrates an isometric view of a FET 100, according to some embodiments. FET 100 can have different cross-sectional views, as illustrated in FIGS. 1B-1E, according to some embodiments. FIGS. 1B-1E illustrate cross-sectional views of FET 100 along line A-A with additional structures that are not shown in FIG. 1A for simplicity. The discussion of elements in FIGS. 1A-1E with the same annotations applies to each other, unless mentioned otherwise. In some embodiments, FET 100 can represent n-type FET 100 (NFET 100) or p-type FET 100 (PFET 100) and the discussion of FET 100 applies to both NFET 100 and PFET 100, unless mentioned otherwise.

Referring to FIG. 1A, FET 100 can include an array of gate structures 112A-112C disposed on a fin structure 106 and an array of S/D regions 110A-110C (S/D region 110C visible in FIG. 1A; 110A-110B visible in FIGS. 1B-1E) disposed on portions of fin structure 106 that are not covered by gate structures 112A-112C. FET 100 can further include gate spacers 114, shallow trench isolation (STI) regions 116, etch stop layers (ESLs) 117A-117B (ESL 117A not shown in FIGS. 1B-1E for simplicity; ESL 117B not shown in FIG. 1A for simplicity, shown in FIG. 1B), and interlayer dielectric (ILD) layers 118A-118C (ILD layers 118B-118C not shown in FIG. 1A for simplicity; shown in FIGS. 1B-1E). ILD layer 118A can be disposed on ESL 117A. In some embodiments, gate spacers 114, STI regions 116, ESLs 117A-117B, and ILD layers 118A-118C can include an insulating material, such as silicon oxide, silicon nitride (SiN), silicon carbon nitride (SiCN), silicon oxycarbon nitride (SiOCN), and silicon germanium oxide. In some embodiments, gate spacers 114 can have a thickness of about 2 nm to about 9 nm for adequate electrical isolation of gate structures 112A-112C from adjacent structures.

FET 100 can be formed on a substrate 104. There may be other FETs and/or structures (e.g., isolation structures) formed on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structure 106 can include a material similar to substrate 104 and extend along an X-axis.

Figure 1B:
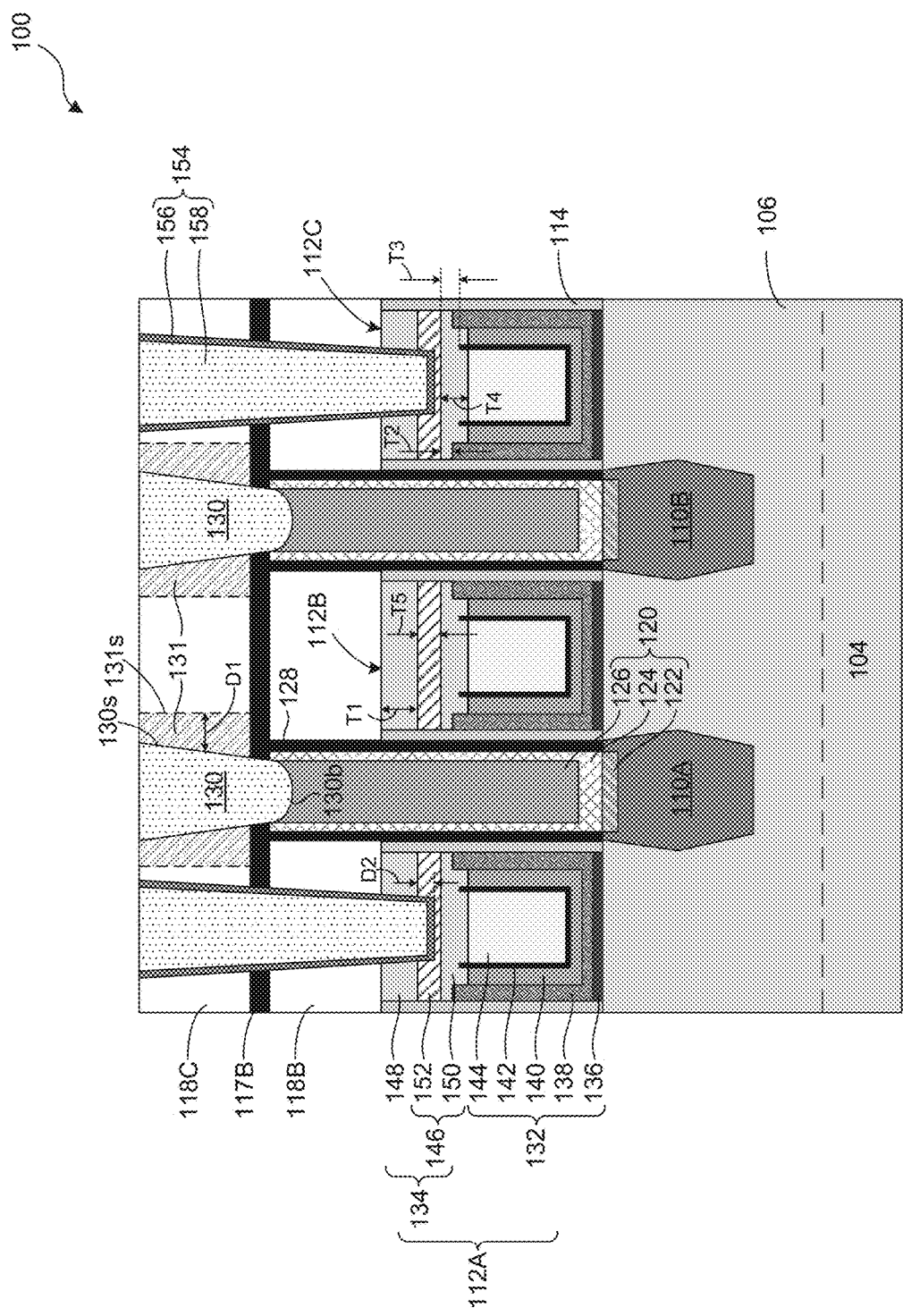
FIGS. 1B-1E illustrate cross-sectional views of a semiconductor device with multi-layered gate capping structures, in accordance with some embodiments.

Referring to FIG. 1B, FET 100 can include S/D regions 110A-110B, S/D contact structures 120 disposed on S/D region 110A-110B, diffusion barrier layers 128, vias 130 disposed on S/D contact structures 120, gate structures 112A-112C covering disposed on fin structure 106, and gate contact structures 154 disposed on gate structures 112A and 112C. The discussion of gate structures 112A-112C applies to each other, unless mentioned otherwise. In some embodiments, gate structure 112B can be a dummy gate structure and may not be electrically connected to other elements of FET 100.

For NFET 100, each of S/D regions 110A-110B can include an epitaxially-grown semiconductor material, such as Si, and n-type dopants, such as phosphorus and other suitable n-type dopants. For PFET 100, each of S/D regions 110A-110B can include an epitaxially-grown semiconductor material, such as Si and SiGe, and p-type dopants, such as boron and other suitable p-type dopants. In some embodiments, each of S/D contact structures 120 can include (i) a silicide layer 122 disposed within each of S/D regions 110A-110B, (ii) an adhesion layer 124 disposed on silicide layer 122, and (iii) a contact plug 126 disposed on adhesion layer 124.

In some embodiments, for NFET 100, silicide layers 122 can include a metal or a metal silicide with a work function value closer to a conduction band-edge energy than a valence band-edge energy of the material of S/D regions 110A-110B. For example, the metal or the metal silicide can have a work function value less than 4.5 eV (e.g., about 3.5 eV to about 4.4 eV), which can be closer to the conduction band energy (e.g., 4.1 eV for Si) than the valence band energy (e.g., 5.2 eV for Si) of Si-based material of S/D regions 110A-110B. In some embodiments, for NFET 100, the metal silicide of silicide layers 122 can include titanium silicide ($Ti_xSi_y$), tantalum silicide ($Ta_xSi_y$), molybdenum ($Mo_xSi_y$), zirconium silicide ($Zr_xSi_y$), hafnium silicide ($Hf_xSi_y$), scandium silicide ($Sc_xSi_y$), yttrium silicide ($Y_xSi_y$), terbium silicide ($Tb_xSi_y$), lutetium silicide ($Lu_xSi_y$), erbium silicide ($Er_xSi_y$), ybtterbium silicide ($Yb_xSi_y$), europium silicide ($Eu_xSi_y$), thorium silicide ($Th_xSi_y$), other suitable metal silicide materials, or a combination thereof.

In some embodiments, for PFET 100, silicide layers 122 can include a metal or a metal silicide with a work function value closer to a valence band-edge energy than a conduction band-edge energy of the material of S/D regions 110A-110B. For example, the metal or the metal silicide can have a work function value greater than 4.5 eV (e.g., about 4.5 eV to about 5.5 eV), which can be closer to the valence band energy (e.g., 5.2 eV for Si) than the conduction band energy (e.g., 4.1 eV for Si) of Si-based material of S/D regions 110A-110B. In some embodiments, for PFET 100, the metal silicide of silicide layers 122 can include nickel silicide ($Ni_xSi_y$), cobalt silicide ($Co_xSi_y$), manganese silicide ($MnxSi_y$), tungsten silicide ($W_xSi_y$), iron silicide ($Fe_xSi_y$), rhodium silicide ($Rh_xSi_y$), palladium silicide ($Pd_xSi_y$), ruthenium silicide ($Ru_xSi_y$), platinum silicide ($Pt_xSi_y$), iridium silicide ($Ir_xSi_y$), osmium silicide ($Os_xSi_y$), other suitable metal silicide materials, or a combination thereof.

Adhesion layers 124 can aid in the formation of contact plugs 126 without voids and can include a metal nitride, such as titanium nitride (TiN), tantalum nitride (TaN), and other suitable metal nitride materials. In some embodiments, each of adhesion layers 124 can include a single layer of metal nitride or can include a stack of metal layer and metal nitride layer. The metal layer can be disposed on silicide layer 122 and metal nitride layer can be disposed on the metal layer. In some embodiments, the metal layer can include Ti, Ta, or other suitable metals and can include the same metal as the metal nitride layer.

Contact plugs 126 can include conductive materials with low resistivity (e.g., resistivity about 50 μΩ-cm, about 40 μΩ-cm, about 30 μΩ-cm, about 20 μΩ-cm, or about 10 μΩ-cm), such as cobalt (Co), tungsten (W), ruthenium (Ru), iridium (Ir), nickel (Ni), Osmium (Os), rhodium (Rh), aluminum (Al), molybdenum (Mo), other suitable conductive materials with low resistivity, and a combination thereof. Diffusion barrier layers 128 can prevent the oxidation of contact plugs 126 by preventing the diffusion of oxygen atoms from ILD layer 118B to contact plugs 126. In some embodiments, diffusion barrier layers 128 can include a dielectric nitride, such as silicon nitride ($Si_xN_y$), silicon oxynitride (SiON), silicon carbon nitride (SiCN), and other suitable dielectric nitride materials.

S/D contact structures 120 can electrically connect to overlying interconnect structures (not shown), power supplies (not shown), and/or other elements of FET 100 through vias 130. Vias 130 can be disposed on S/D contact structures 120 and can include conductive materials, such as Ru, Co, Ni, Al, Mo, W, Ir, Os, Cu, and Pt. In some embodiments, the conductive materials of vias 130 are formed by a bottom-up approach, which is described in detail below, and as a result, vias 130 are formed without adhesion layers (also referred to as "liners" or "glue layers") along the sidewalls of vias 130. In some embodiments, vias 130 can be formed using a precursor gas of tungsten hexafluoride ($WF_6$), and as a result, vias 130 can include tungsten with impurities of fluorine atoms. The concentration of fluorine atom impurities in each via 130 can range from about 1 atomic percent to about 10 atomic percent of the total concentration of atoms in each via 130. In some embodiments, bottom surfaces 130b of vias 130 can have curved profiles to increase the contact area between vias 130 and contact plugs 126, and consequently decrease the contact resistance between vias 130 and contact plugs 126. In some embodiments, vias 130 can have diameters (or widths) along an X-axis ranging from about 10 nm to about 20 nm to provide an optimal contact area between S/D contact structures 120 and overlying interconnect structures (not shown) without compromising device size and manufacturing cost.

In some embodiments, vias 130 can be surrounded by doped regions 131 of ILD layer 118C. Doped regions 131 can include dopants with atoms that have atomic radii larger than the atomic radii of Si atoms in ILD layer 118C. For example, ILD layer 118C can include $SiO_2$ and doped regions 131 of ILD layer 118C can include dopant Ge atoms or other suitable dopant atoms, which have atomic radii larger than the atomic radii of Si atoms. The dopant atoms are introduced in ILD layer 118C to close any gaps at the interfaces between vias 130 and ILD layer 118C during the fabrication of vias 130, which is described in detail below. In some embodiments, each of doped regions 131 can have a dopant concentration ranging from about 1 atomic percent to about 10 atomic percent of the total concentration of atoms in ILD layer 118C for adequately sealing any gaps at the interfaces between vias 130 and ILD layer 118C. In some embodiments, doped region 131 can extend a distance D1 ranging from about 1 nm to about 60 nm from sidewall 130s of via 130. In other words, sidewall 131 of doped region 131 is spaced apart from sidewall 130s of via 130 by distance D1. The regions of ILD layer 118C adjacent to doped regions 131 can be undoped or can have a dopant concentration less than about 1 atomic percent of the total concentration of atoms in ILD layer 118C due to migration of dopant atoms from doped regions 131.

Referring to FIG. 1B, each of gate structures 112A-112C can include a gate stack 132 disposed on fin structure 106 and a gate capping structure 134 disposed on gate stack 132. Gate stack 132 can include (i) an interfacial oxide (IO) layer 136 disposed on fin structure 106, (ii) a high-k (HK) gate dielectric layer 138 disposed on IO layer 136, (iii) a WFM layer 140 disposed on HK gate dielectric layer 138, (iv) an oxygen barrier layer 142 disposed on WFM layer 140, and (v) a gate metal fill layer 144 disposed on oxygen barrier layer 142.

In some embodiments, IO layer 136 can include $SiO_2$, silicon germanium oxide ($SiGeO_x$), germanium oxide ($GeO_x$), or other suitable oxide materials. In some embodiments, HK gate dielectric layer 138 can include (i) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$), and (ii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), (iii) a combination thereof, or (iv) other suitable high-k dielectric materials. As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

For NFET 100, WFM layer 140 can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based conductive materials, or a combination thereof. For PFET 100, WFM layer 140 can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), other suitable substantially Al-free conductive materials, or a combination thereof.

Oxygen barrier layer 142 can prevent the oxidation of WFM layer 140 during the processing of overlying layers (e.g., gate metal fill layer 144 and/or gate capping structure 134) and can include Si, Ge, Ti, Al, Hf, Ta, Ni, Co, silicon oxide ($SiO_x$), germanium oxide ($GeO_x$), titanium oxide ($TiO_x$), aluminum oxide ($AlO_x$), hafnium oxide ($HfO_x$), tantalum oxide ($TaO_x$), nickel oxide ($NiO_x$), cobalt oxide ($CoO_x$), indium oxide ($InO_x$), zinc oxide ($ZnO_x$), zirconium oxide ($ZrO_x$), magnesium oxide ($MgO_x$), or other suitable materials capable of blocking oxygen atoms from diffusing into WFM layer 140. WFM layer 140 is prevented from being oxidized because oxidized WFM layer 140 can shift the work function value of gate stack 132, and consequently increase the threshold voltage of FET 100. In some embodiments, oxygen barrier layer 142 can include a thickness ranging from about 1 nm to about 2 nm. Below the thickness of 1 nm, oxygen barrier layer 142 may not adequately prevent the oxidation of WFM layer 140. On the other hand, if the thickness is greater than 2 nm, the volume area for gate metal fill layer 144 decreases, and consequently increases the gate resistance of gate structures 112A-112C.

Figure 1C:
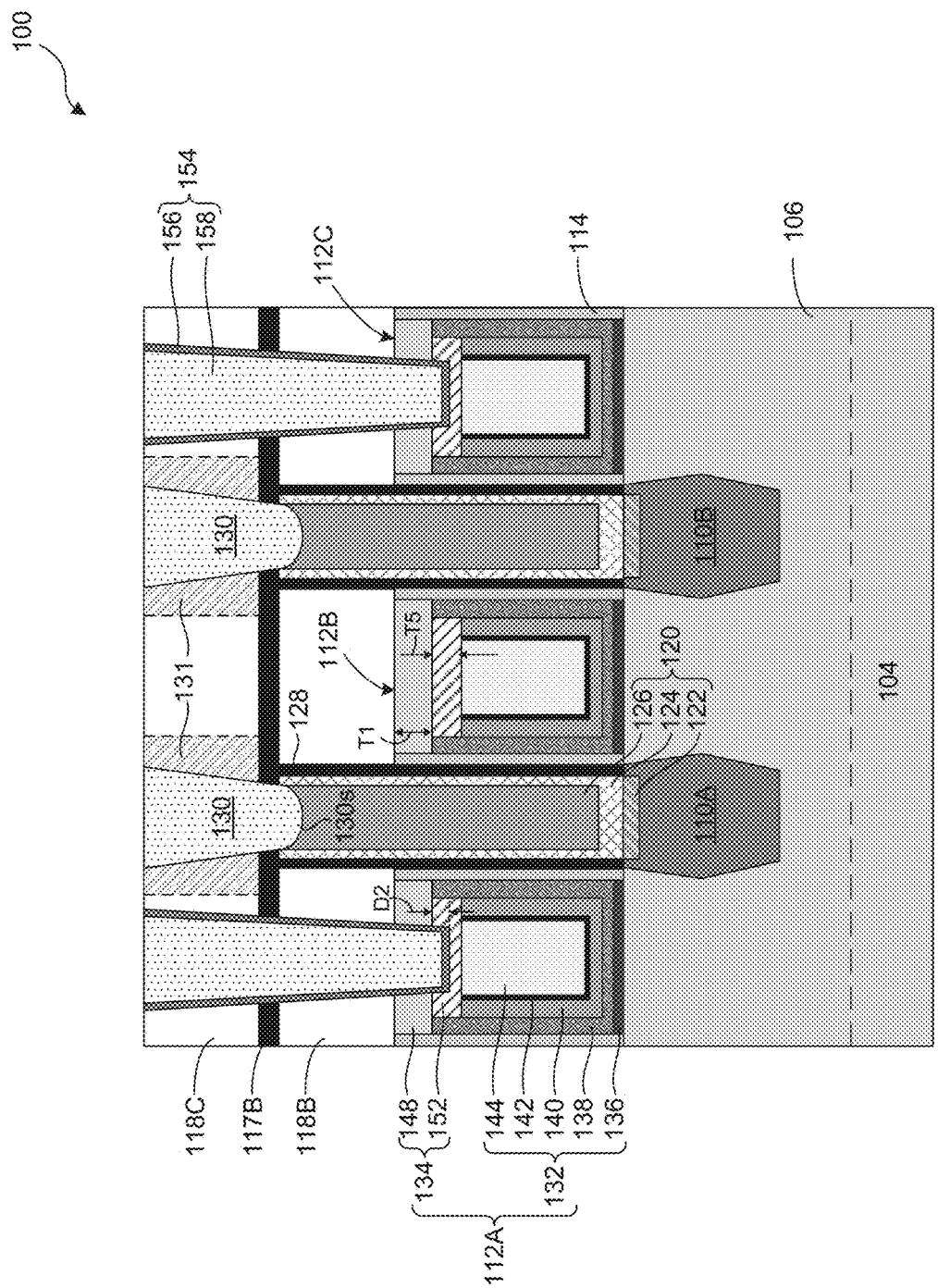

In some embodiments, oxygen barrier layer 142 extends above the top surfaces of WFM layer 140 and/or gate metal fill layer 144, as shown in FIG. 1B, when oxygen barrier layer 142 includes a dielectric and/or an oxide material, such as $SiO_x$, $GeO_x$, $HfO_x$, $TiO_x$, $AlO_x$, $TaO_x$, $NiO_x$, $CoO_x$, $InO_x$, $ZnO_x$, $ZrO_x$, and $MgO_x$, or other suitable dielectric materials and/or oxides. On the other hand, oxygen barrier layer 142 is substantially coplanar with the top surfaces of WFM layer 140 and/or gate metal fill layer 144, as shown in FIG. 1C, when oxygen barrier layer 142 includes a metallic material, such as Ti, Al, Ta, Ni, and Co, or other suitable metallic material. The planarity of the top surface of oxygen barrier layer 142 with respect to the top surfaces of WFM layer 140 and/or gate metal fill layer 144 depends on the relative etching rates of the materials of oxygen barrier layer 142, WFM layer 140, and gate metal fill layer 144 during the fabrication of gate stack 132, which is described in detail below.

In some embodiments, gate metal fill layer 144 can include a suitable conductive material, such as tungsten (W), titanium (Ti), silver (Ag), ruthenium (Ru), molybdenum (Mo), copper (Cu), cobalt (Co), aluminum (Al), iridium (Ir), nickel (Ni), other suitable conductive materials, or a combination thereof. In some embodiments, gate metal fill layer 144 can include a substantially fluorine-free metal layer (e.g., fluorine-free W). The substantially fluorine-free metal layer can include an amount of fluorine contaminants less than about 5 atomic percent in the form of ions, atoms, and/or molecules.

In some embodiments, gate capping structure 134 can include a conductive gate cap 146 disposed on gate stack 132 and an insulating gate cap 148 disposed on conductive gate cap 146. Insulating gate cap 148 protects the underlying conductive gate cap 146 and gate stack 132 from structural and/or compositional degradation during subsequent processing of the semiconductor device. In some embodiments, insulating gate cap 148 can include a nitride material, such as silicon nitride, and can have a thickness T1 ranging from about 2 nm to about 10 nm for adequate protection of the underlying conductive gate cap 146 and gate stack 132.

Conductive gate cap 146 provides a conductive interface between gate stack 132 and gate contact structure 154 to electrically connect gate stack 132 to gate contact structure 154 without forming gate contact structure 154 directly on or within gate stack 132. Gate contact structure 154 is not formed directly on or within gate stack 132 to prevent contamination of gate stack 132 by any of the processing materials used in the formation of gate contact structure 154, which is described in detail below. Contamination of gate stack 132 can lead to the degradation of device performance. Thus, with the use of conductive gate cap 146, gate stack 132 can be electrically connected to gate contact structure 154 without compromising the integrity of gate structures 112A-112C.

In some embodiments, conductive gate cap 146 can include a growth promotion layer (GPL) 150 disposed on gate stack 132 and an etch stop layer (ESL) 152 disposed on GPL 150 when oxygen barrier layer 142 includes a dielectric material and/or an oxide, as shown in FIG. 1B. GPL 150 and ESL 152 can include conductive materials different from each other. In some embodiments, GPL 150 can include a nitride material, such as titanium nitride (TiN), tantalum nitride (TaN), tungsten nitride (WN), molybdenum nitride (MoN), other suitable nitride materials, and a combination thereof. In some embodiments, ESL 152 can include a metallic material, such as W, Ru, Ir, Mo, other suitable metallic materials, and a combination thereof. In some embodiments, ESL 152 can be formed using a precursor gas of tungsten pentachloride ($WCl_5$) or tungsten hexachloride ($WCl_6$), and as a result, ESL 152 can include tungsten with impurities of chlorine atoms. The concentration of chlorine atom impurities can range from about 1 atomic percent to about 10 atomic percent of the total concentration of atoms in each ESL 152.

GPL 150 can provide a surface favorable for bottom up deposition of ESL 152 when oxygen barrier layer 142 includes a dielectric material and/or an oxide, as shown in FIG. 1B, since a dielectric and/or an oxide material can inhibit the bottom-up deposition of the metallic material of ESL 152. In some embodiments, when oxygen barrier layer 142 includes a metallic material, ESL 152 can be deposited, using the bottom-up deposition process, on gate stack 132 without GPL 150, as shown in FIG. 1C and ESL 152 can serve as conductive gate cap 146. The bottom-up deposition process selectively deposits ESL 152 directly or indirectly on gate stack 132 and prevents ESL 152 from depositing on FET structures, such as spacers 114 and ILD layer 118A, that can electrically short with subsequently-formed adjacent structures, such as S/D contact structures 120.

ESL 152 can control the depth profile of gate contact structure 154 and prevent gate contact structure 154 from extending into gate stack 132 in addition to providing the conductive interface between gate stack 132 and gate contact structure 154. In some embodiments, ESL 152 can have a thickness T5 ranging from about 2 nm to about 15 nm and gate contact structure 154 can extend a distance D2 ranging from about 1 nm to about 10 nm into ESL 152 for adequately controlling the depth profile of gate contact structure 154. To prevent gate contact structure 154 from extending into GPL 150 (FIG. 1B) or into gate stack 132 (FIG. 1C), ESL 152 is formed with thickness T5 greater than D2.

GPL 150 can include a material, such as the nitride material, for which ESL 152 has a deposition selectivity that is higher than the deposition selectivity for the dielectric and/or oxide materials of HK gate dielectric layer 138 and oxygen barrier layer 142. As used herein, the term "deposition selectivity" refers to the ratio of the deposition rates on two different materials or surfaces under the same deposition conditions. In some embodiments, GPL 150 can have a non-uniform thickness across the top surface of gate stack 132. A first portion of GPL 150 on HK gate dielectric layer 138 can have a thickness T2, a second portion of GPL 150 on oxygen barrier layer 142 can have a thickness T3, which can be greater than thickness T2, and a third portion of GPL 150 on gate metal fill layer 144 and WFM layer 140 can have a thickness T4, which can be greater than thicknesses T2-T3. For adequately promoting the bottom up deposition of ESL 152, thicknesses T2-T4 can range from about 1 nm to about 5 nm.

Gate contact structure 154 can include a liner 156 and a contact plug 158 disposed on liner 156. In some embodiments, liner 156 can include a nitride material, such as TiN, and contact plug 158 can include a conductive material similar to via 130. In some embodiments, liner 156 can include a dual layer of Ti and TiN and contact plug 158 can include W. In some embodiments, liner 156 can include TaN and contact plug 158 can include Ru.

Figure 1D:
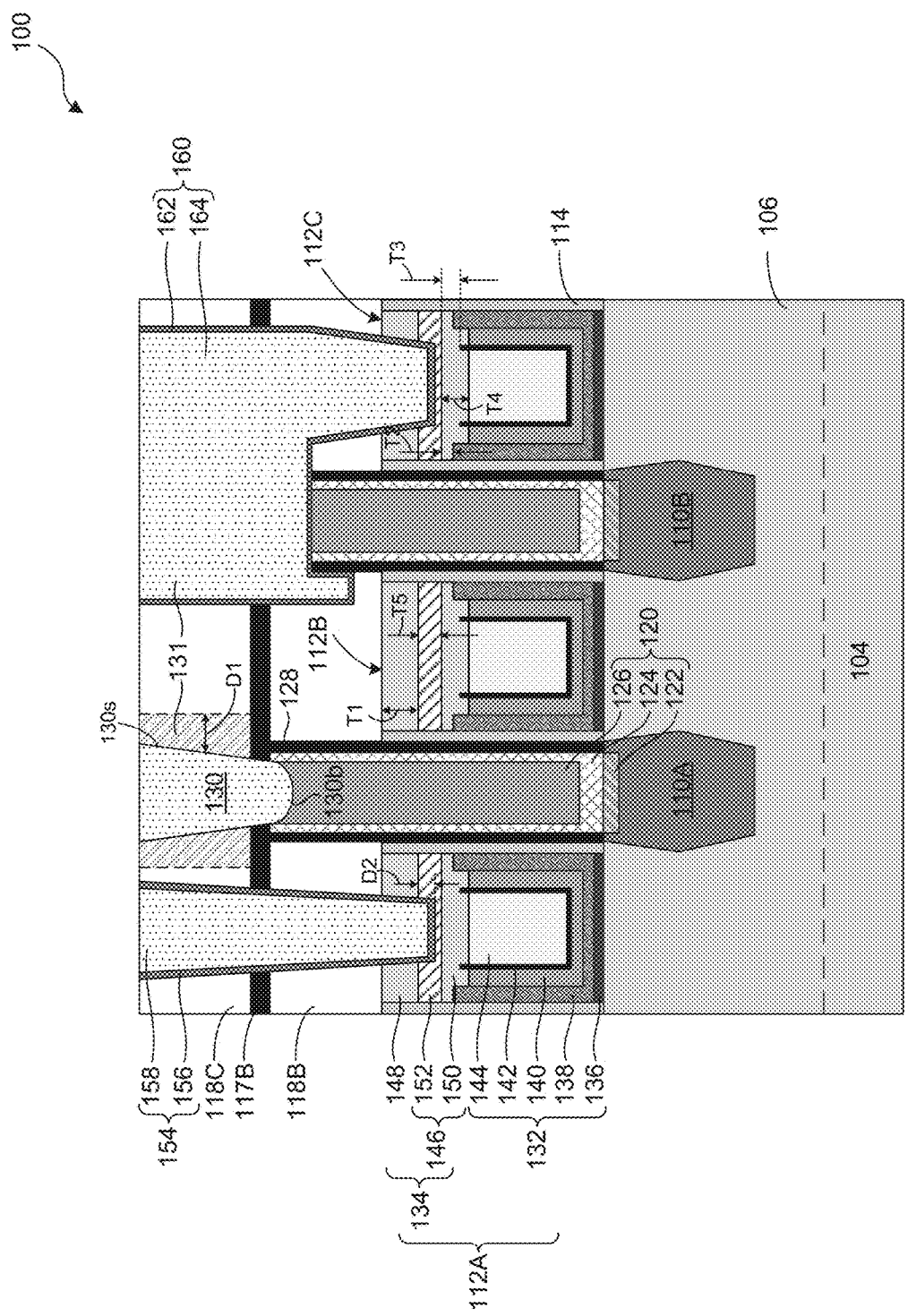

In some embodiments, instead of via 130 over S/D region 110B and gate contact structure 154 on gate structure 112C, a merged via-contact structure 160 is disposed on S/D region 110B and gate structure 112C, as shown in FIG. 1D. Merged via-contact structure 160 electrically connects S/D region 110B and gate structure 112C with each other and with overlying interconnect structures (not shown) when FET 100 is formed in a logic device area and/or in a static random access memory (SRAM) device area of an integrated circuit (not shown). Merged via-contact structure 160 can include a liner 162 and a contact plug 164 disposed on liner 162. In some embodiments, liner 162 and contact plug 164 can include material similar to liner 156 and contact plug 158, respectively.

Figure 1E:
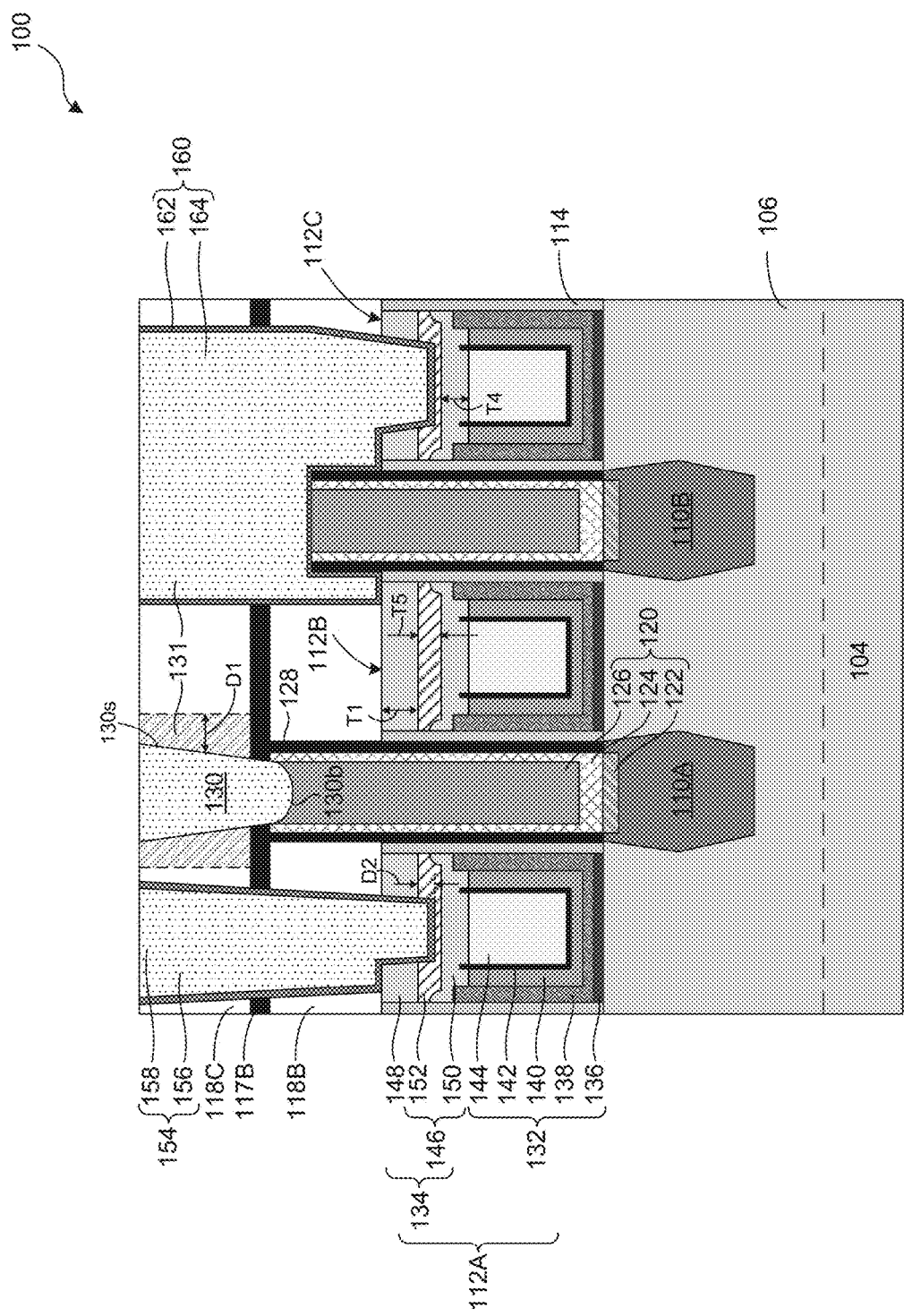

In some embodiments, referring to FIG. 1E, gate contact structure 154, gate capping structure 134, and merged via-contact structure 160 can have cross-sectional views different from the cross-sectional views shown in FIGS. 1B-1D. In some embodiments, GPL 150 can have a non-coplanar top surface with raised edges, as shown in FIG. 1E, instead of the substantially coplanar top surface of GPL 150 shown in FIGS. 1B and 1D. In some embodiments, a portion of merged via-contact structure 160 can be disposed on gate structure 112B, as shown in FIG. 1E.

Figure 2:
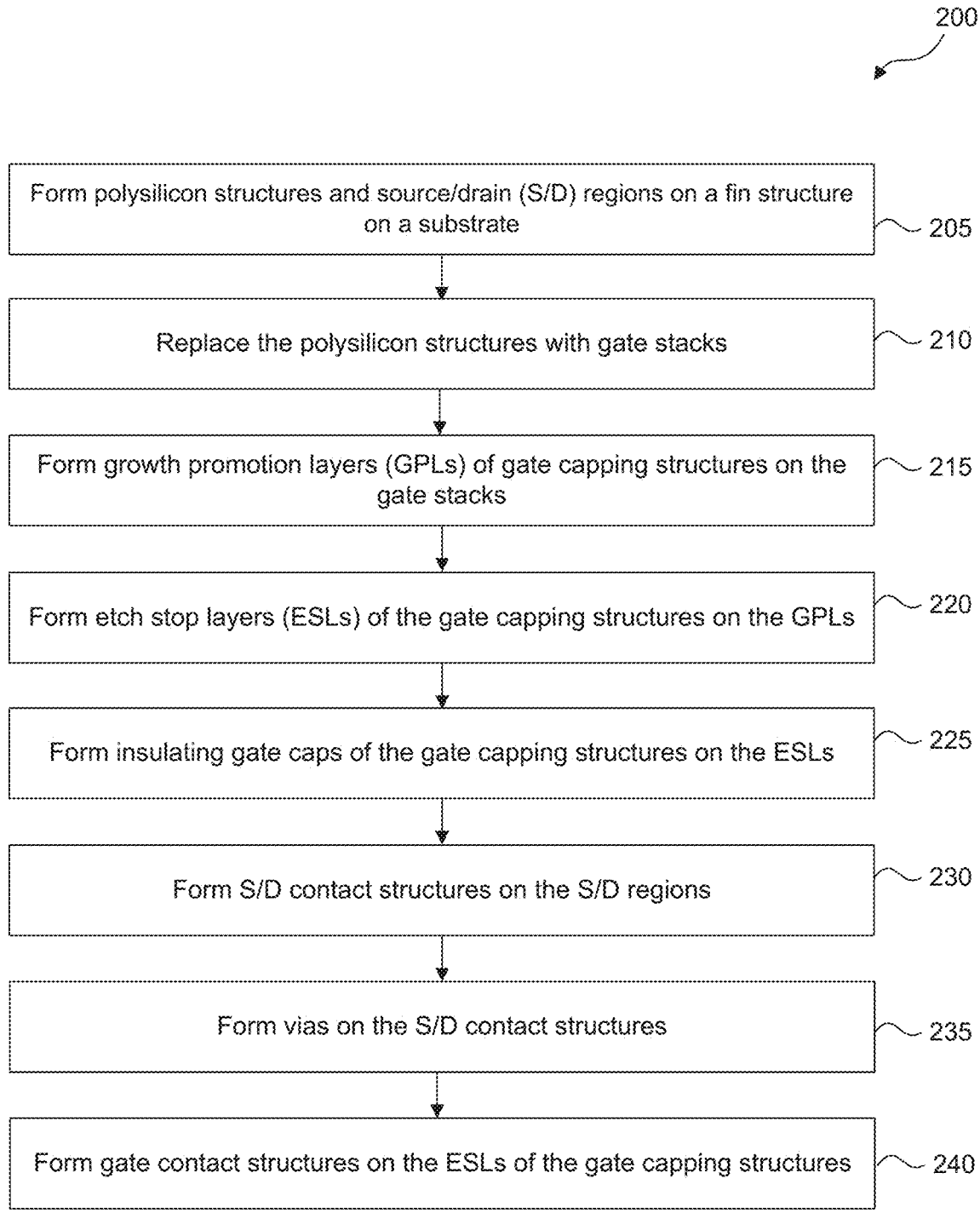
FIG. 2 is a flow diagram of a method for fabricating a semiconductor device with multi-layered gate capping structures, in accordance with some embodiments.

FIG. 2 is a flow diagram of an example method 200 for fabricating FET 100 with cross-sectional view shown in FIG. 1B, according to some embodiments. For illustrative purposes, the operations illustrated in FIG. 2 will be described with reference to the example fabrication process for fabricating FET 100 as illustrated in FIGS. 3-27. FIGS. 3-27 are cross-sectional views of FET 100 along line A-A of FIG. 1A at various stages of fabrication, according to some embodiments. Operations can be performed in a different order or not performed depending on specific applications. It should be noted that method 200 may not produce a complete FET 100. Accordingly, it is understood that additional processes can be provided before, during, and after method 200, and that some other processes may only be briefly described herein. Elements in FIGS. 3-27 with the same annotations as elements in FIGS. 1A-1E are described above.

Figure 3:
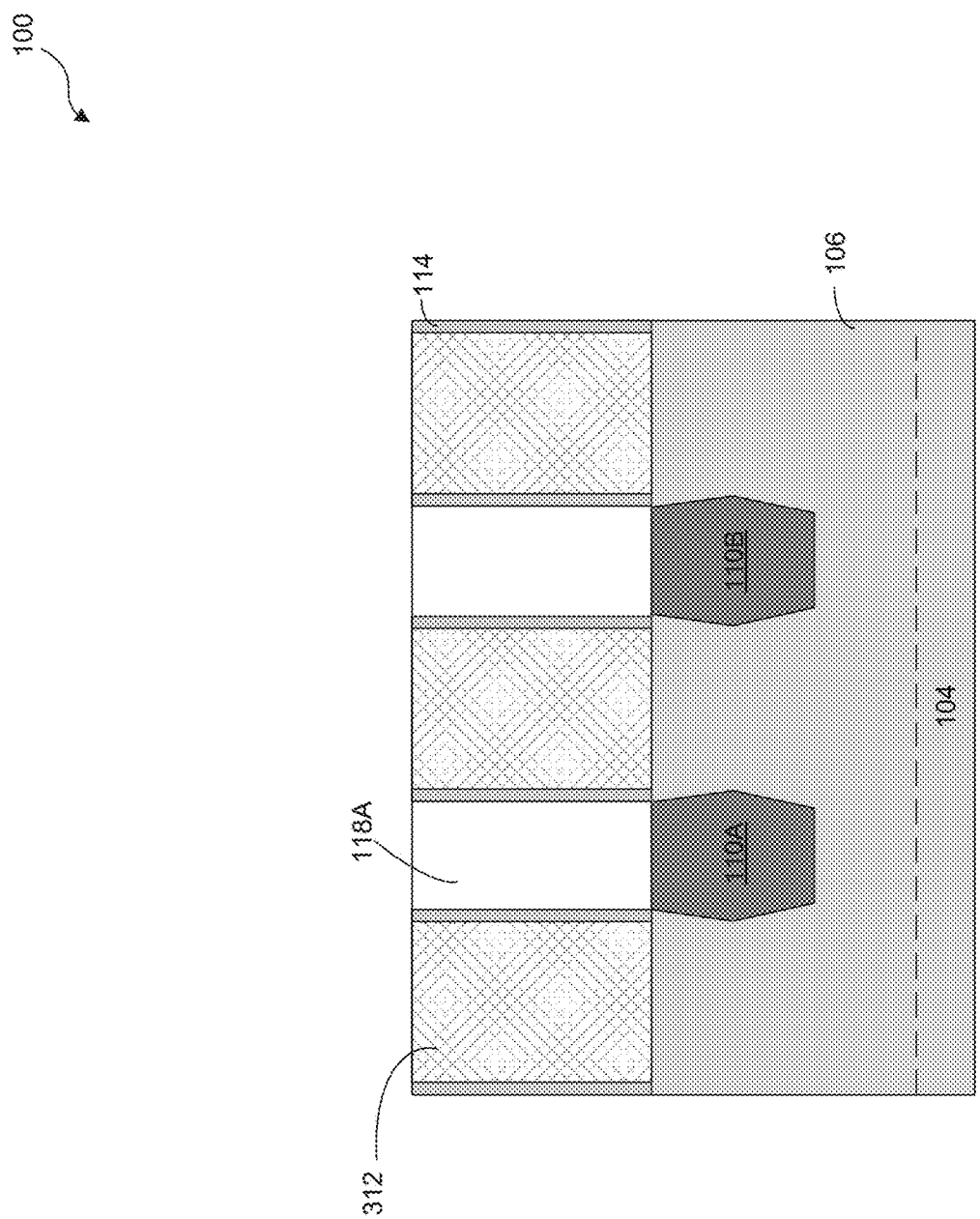
FIGS. 3-27 illustrate cross-sectional views of a semiconductor device with multi-layered gate capping structures at various stages of its fabrication process, in accordance with some embodiments.

In operation 205, polysilicon structures and S/D regions are formed on a fin structure on a substrate. For example, as shown in FIG. 3, polysilicon structures 312 and S/D regions 110A-110B are formed on fin structure 106, which are formed on substrate 104. During subsequent processing, polysilicon structures 312 can be replaced in a gate replacement process to form gate structures 112A-112C. After the formation of S/D regions 110A-110C, ESL 117A (shown in FIG. 1A; not shown in FIGS. 3-27 for simplicity) and ILD layer 118A can be formed to form the structure of FIG. 3.

Figure 4:
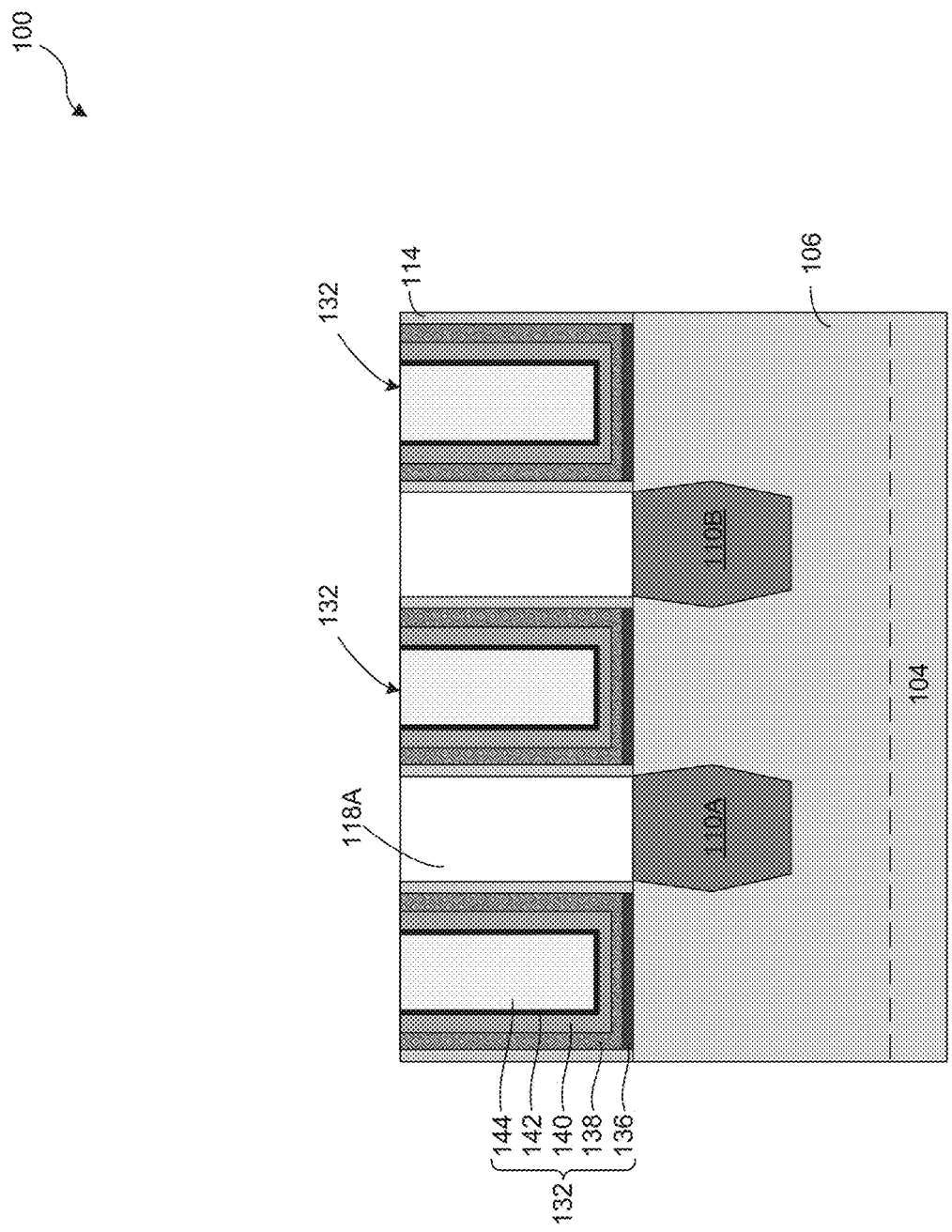

Referring to FIG. 2, in operation 210, polysilicon structures are replaced with gate stacks. For example, as described with reference to FIGS. 4-5, polysilicon structures 312 are replaced with gate stacks 132. The formation of gate stacks 132 can include sequential operations of (i) replacing polysilicon structures 312 with the layers—I/O layers 136, HK gate dielectric layers 138, WFM layers 140, oxygen barrier layers 142, and gate metal fill layers 144—of gate stacks 132, as shown in FIG. 4, and (ii) etching the layers of gate stacks 132 to form gate cap openings 566, as shown in FIG. 5.

Figure 6:
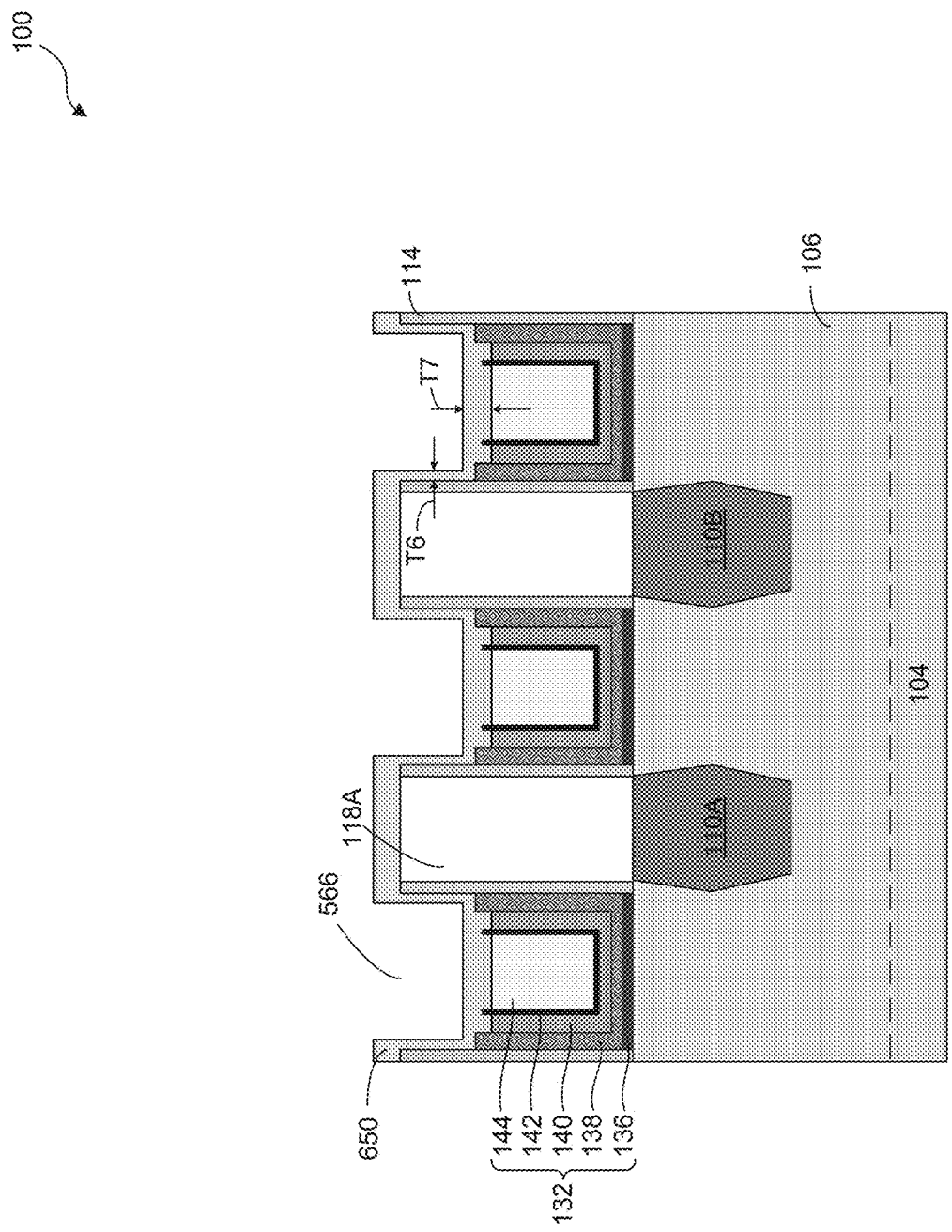
Figure 7:
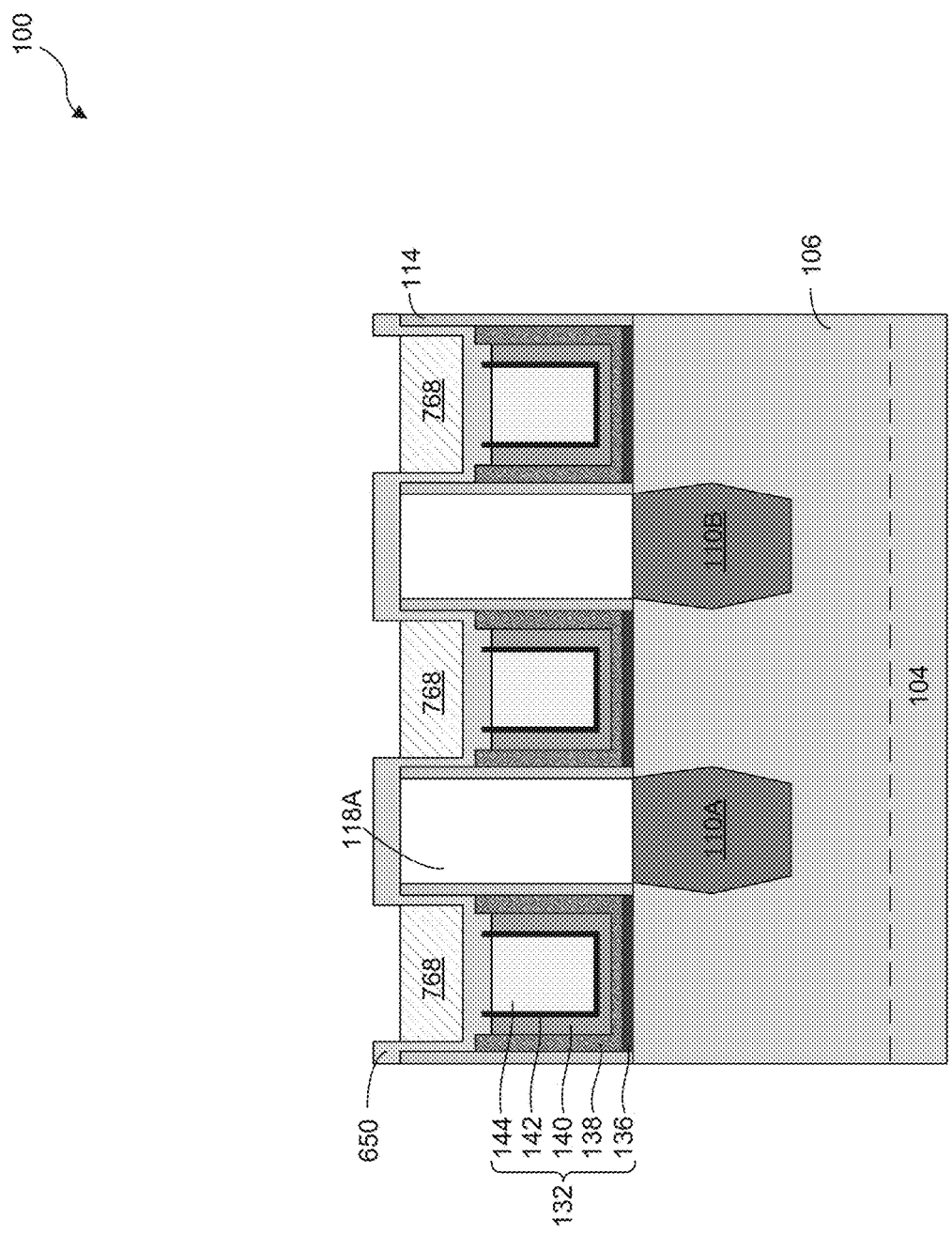
Figure 8:
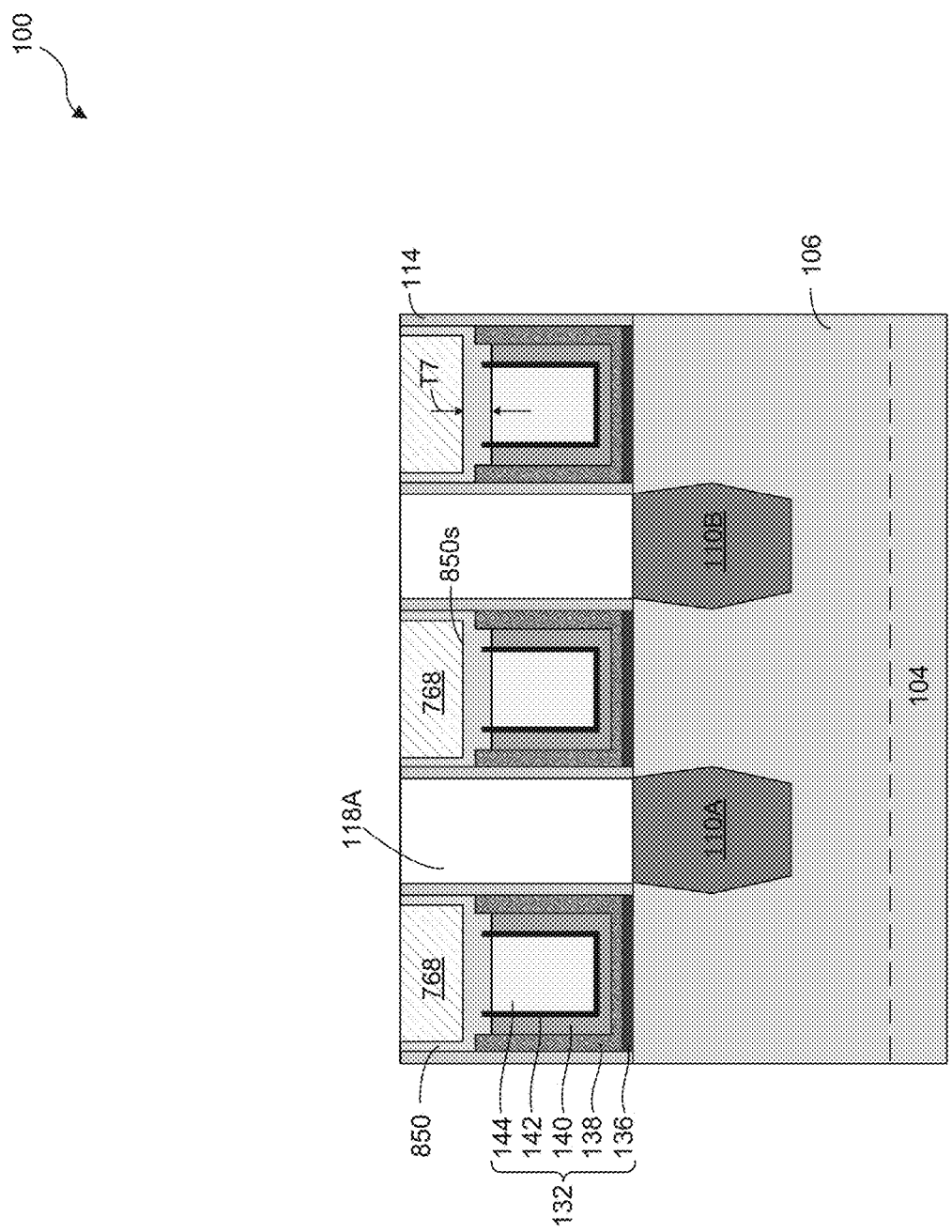
Figure 9:
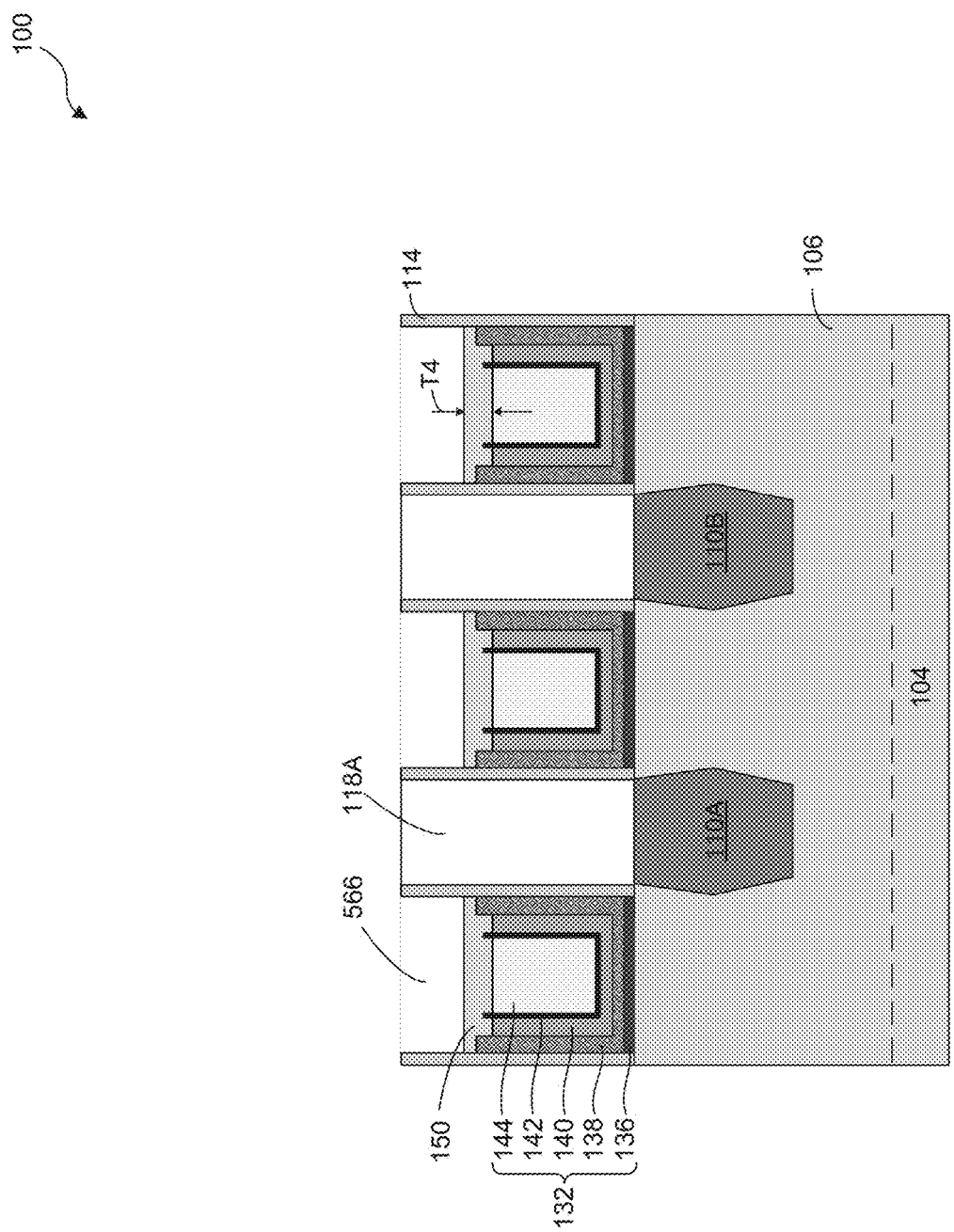

Referring to FIG. 2, in operation 215, GPLs of gate capping structures are formed on the gate stacks. For example, as described with reference to FIGS. 6-9, GPLs 150 are formed on gate stacks 132. The formation of GPLs 150 can include sequential operations of (i) forming a metal nitride layer 650 on the structure of FIG. 5, as shown in FIG. 6, (ii) forming masking layers 768 (e.g., photoresist layers or anti-reflective coatings) on portions of metal nitride layer 650 within gate cap openings 566, as shown in FIG. 7, (iii) etching (e.g., wet etching) metal nitride layer 650 to form metal nitride layers 850 with top surfaces substantially coplanar with top surfaces of gate spacers 114 and masking layers 768, as shown in FIG. 8, (iv) removing masking layers 768 from the structure of FIG. 8, as shown in FIG. 9, and (v) selectively etching sidewall portions of metal nitride layers 850 extending above surfaces 850s of the structure of FIG. 8 to form GPLs 150, as shown in FIG. 9.

Figure 5:
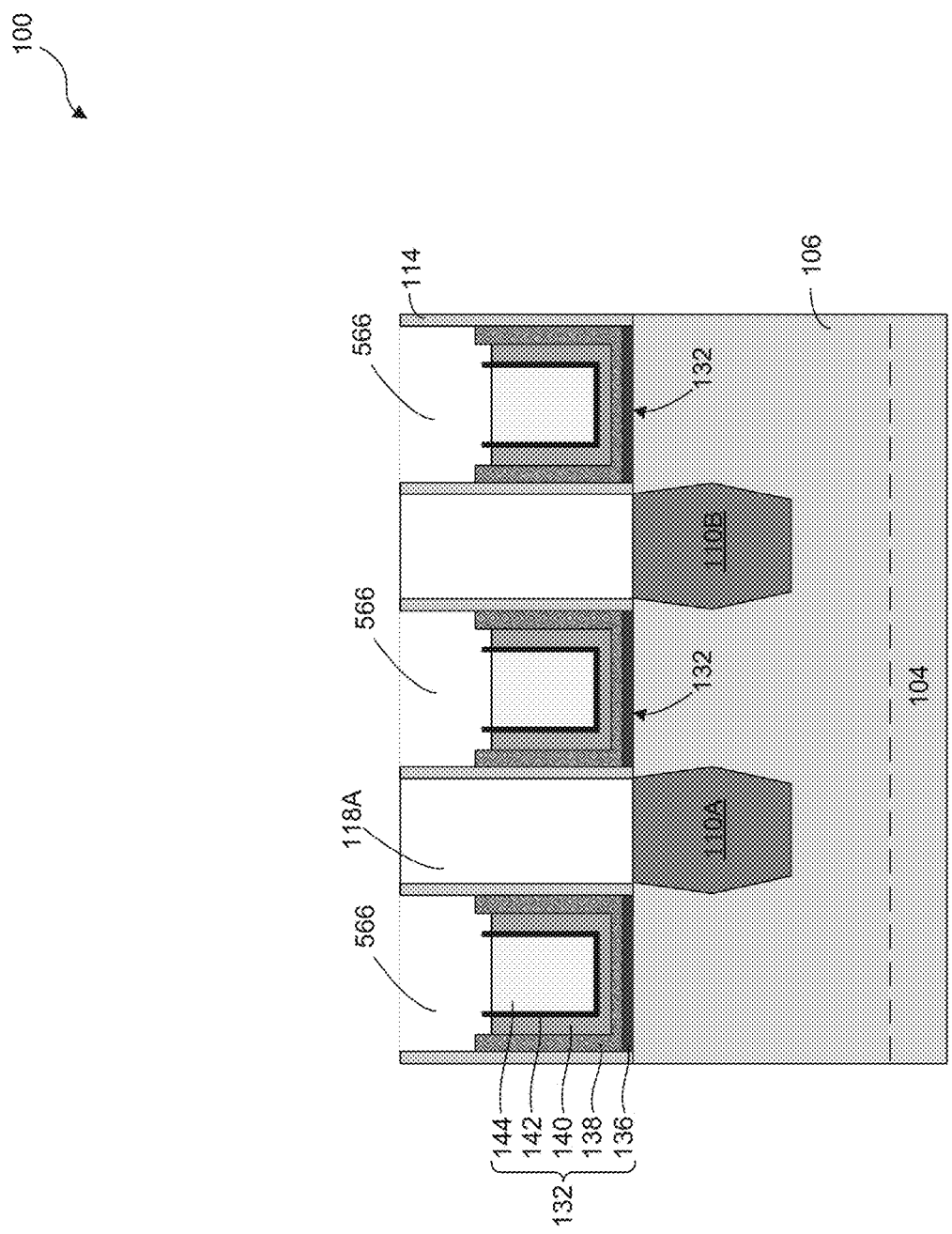

The formation of metal nitride layer 650 can include sequential operations of (i) depositing a metal layer (not shown) on the structure of FIG. 5 using a directional deposition process, such as a physical deposition process (PVD) and other suitable directional deposition processes, and (ii) performing a nitridation process on the deposited metal layer using ammonia ($NH_3$) or nitrogen gas. Metal nitride layer 650 is formed with a thickness T6 along the sidewalls of gate cap openings 566 and with a thickness T7, which is greater than thickness T6, on gate metal fill layers 144. Portions of metal nitride layer 650 along the sidewalls of gate cap openings 566 is formed thinner than those on gate metal fill layers 144 for the ease of selectively removing the portions along the sidewalls.

Figure 32:
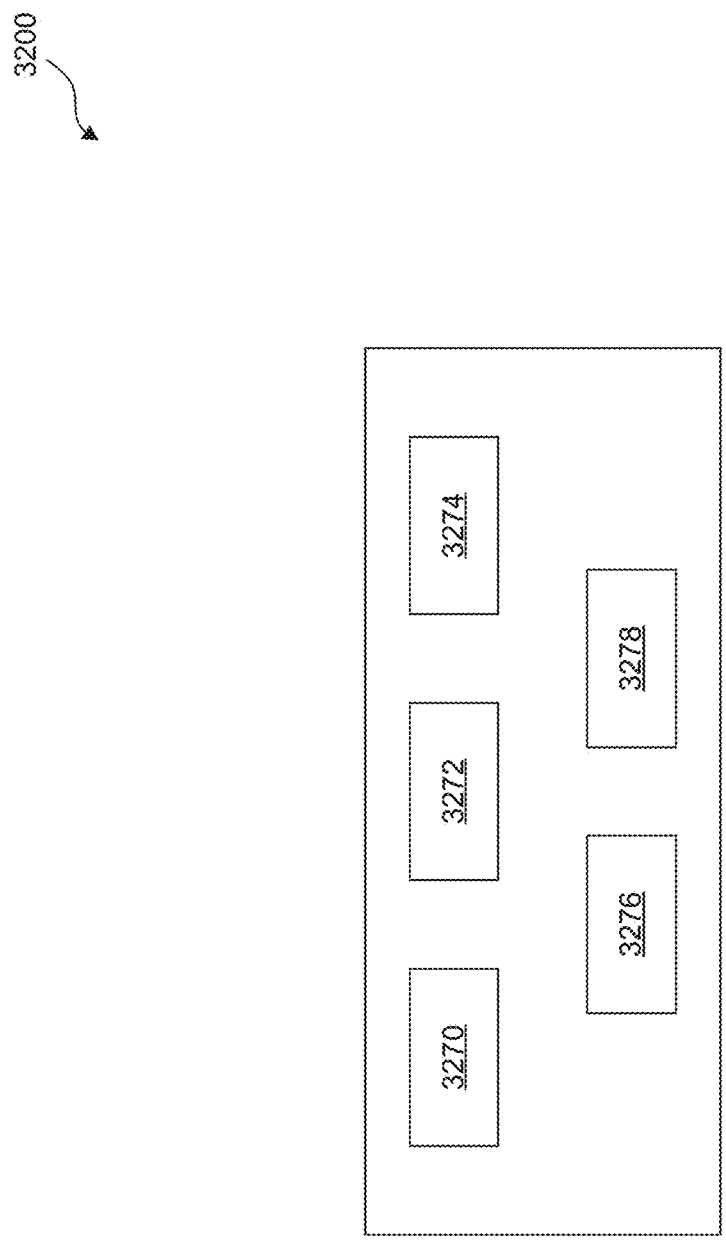
FIG. 32 illustrates a block diagram of a control system of an atomic layer etch (ALE) system, in accordance with some embodiments.

The selective etching of the sidewall portions of metal nitride layers 850 can include etching with an atomic layer etch (ALE) process using $WCl_5$ gas, $O_2$ gas, and argon gas or other suitable gases. In some embodiments, each cycle of the ALE process can include sequential periods of: (i) first etching gas (e.g., $WCl_5$) flow, (ii) a first purging process with argon gas, (iii) a second etching gas (e.g., $O_2$) gas flow, and (iv) a second purging process with argon gas. In some embodiments, the ALE process for etching the sidewall portions can include sequential operations of (i) predicting an etching recipe using a training module 3270 of an ALE control system 3200 shown in FIG. 32, (ii) based on the predicted etching recipe, adjusting the process parameters of an etching apparatus (not shown) using a communication module 3272 of ALE control system 3200, (iii) based on the adjusted process parameters, etching the sidewall portions with the etching apparatus, (iv) measuring the thicknesses of the remaining sidewall portions with a measurement system (not shown), (v) sending the measurement data to a memory 3274 of ALE control system 3200, (vi) analyzing the measurement data with an analysis module 3276 of ALE control system 3200 to determine if the thicknesses of the remaining sidewall portions are equal to about zero nm, and (vii) ending the etching process in the etching apparatus using a processor 3278 and/or communication module 3272 of ALE control system 3200 if the thicknesses are equal to about zero nm or repeating operations (i)-(vi) until the thicknesses are equal to about zero nm and GPLs 150 are formed, as shown in FIG. 9. In some embodiments, training module 3270, communication module 3272, memory 3274, analysis module 3276, and processor 3278 are wired to or wirelessly connected to each other. In some embodiments, the adjustment of the process parameters of the etching apparatus can include adjusting etching duration, etching gas flow, and/or etching temperature.

The prediction of the etching recipe with ALE control system 3200 can include performing a computing procedure to (i) analyze etching process data collected from previous etching processes performed on other structures with the etching apparatus, and (ii) predict, based on the analyzed data, the etching process characteristics (e.g., etching rate, etching duration) for etching the sidewall portions with different etching process parameters (e.g., ampoule lifetime, temperature and humidity of etching chamber, light adsorption or reflection within the etching chamber, pressure within the etching chamber, carrier gas condition, etching gas supply pipe length, etc.). The computer procedure can include one or more mathematical operations, a pattern recognition procedure, a big data mining procedure, or a machine learning procedure, such as a neural network algorithm, to analyze the etching process data (e.g., ampoule lifetime, etching chamber lifetime, effective etching density, effective etching area size, etching gas parameters, etc.) and predict the etching process characteristics. Similarly, the analysis of the measurement data with ALE control system 3200 can include performing a computing procedure. In some embodiments, the portions of metal nitride layers 850 on gate stacks 132 can be etched during the ALE process and can be thinned down to thicknesses T4, as shown in FIG. 9.

Figure 10:
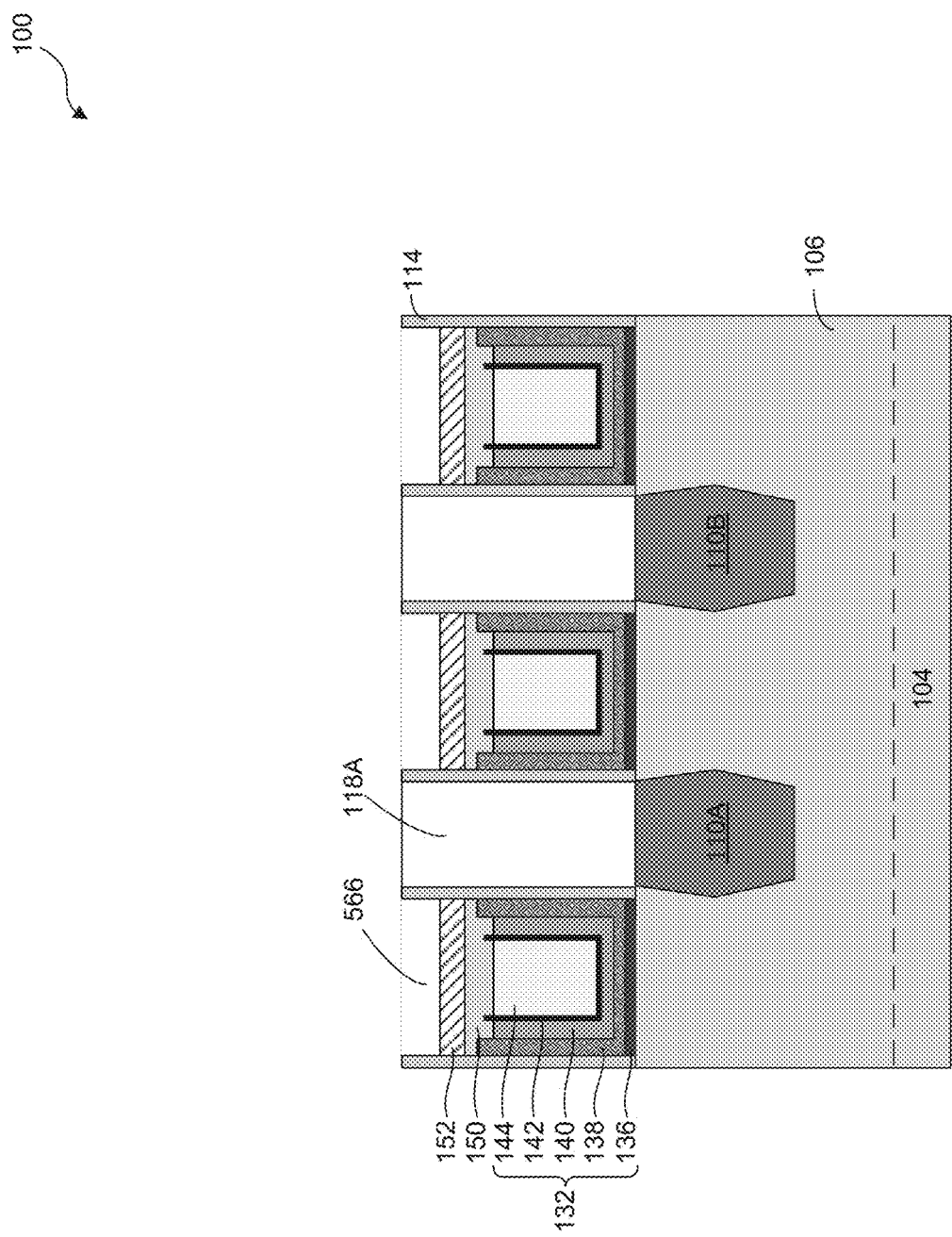

Referring to FIG. 2, in operation 220, ESLs of the gate capping structures are formed on the GPLs. For example, as shown in FIG. 10, ESLs 152 are formed on GPLs 150. In some embodiments, the formation of ESLs 152 can include depositing fluorine-free W layers of about 3 nm to about 5 nm on GPLs 150 using a bottom-up deposition process with a $WCl_5$ precursor gas at a temperature ranging from about 300° C. to about 550° C. and at a pressure ranging from about 15 torr to about 40 torr. Other thicknesses, temperatures, and pressure ranges are within the scope of the disclosure. The use of fluorine-free W for ESLs 152 prevent degradation of underlying gate stacks 132 from fluorine contamination.

Figure 11:
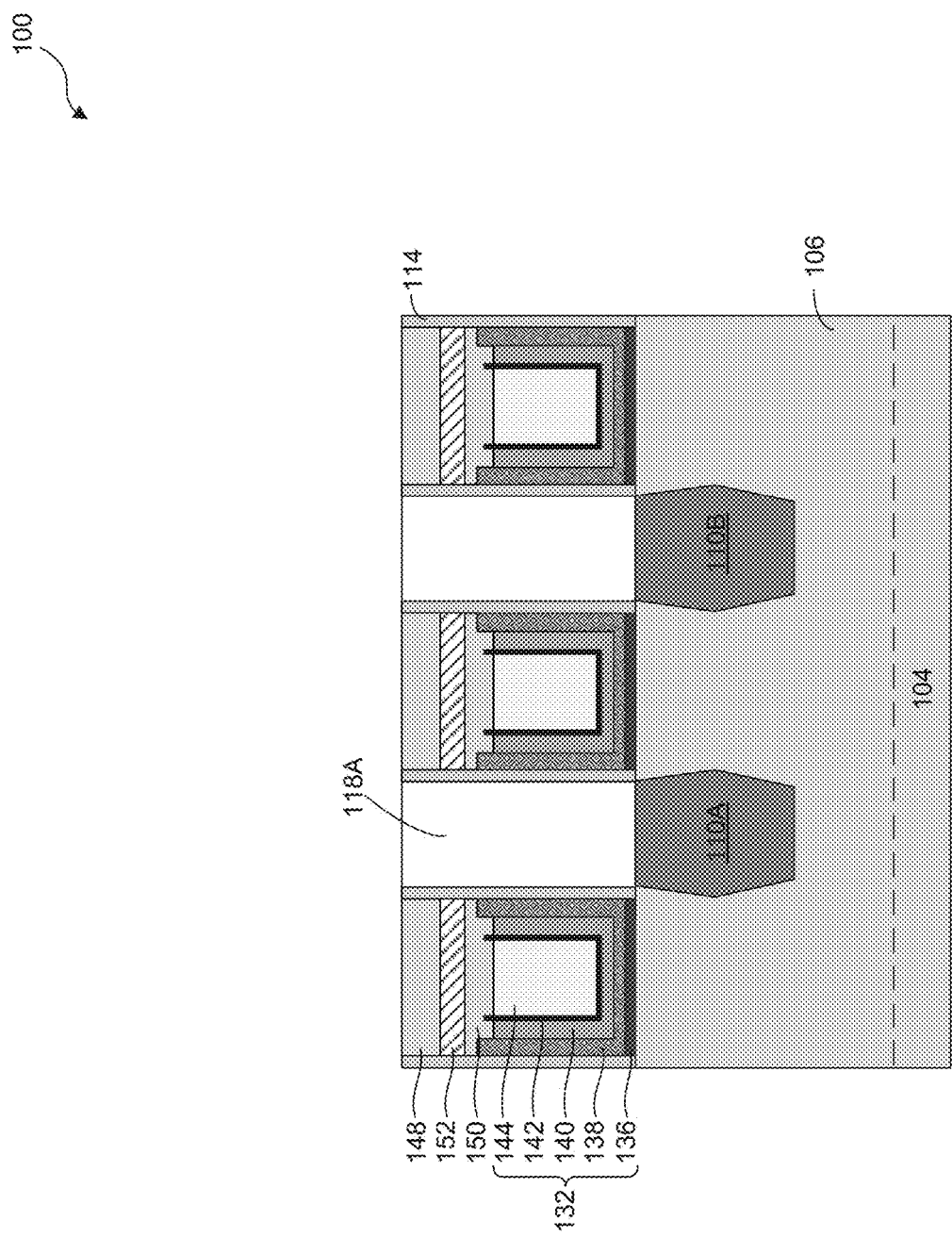

Referring to FIG. 2, in operation 225, insulating gate caps of the gate capping structures are formed on the ESLs. For example, as shown in FIG. 11, insulating gate caps 148 are formed on ESLs 152. The formation of insulating gate caps 148 can include sequential operations of (i) depositing an insulating nitride layer (not shown) on the structure of FIG. 10, and (ii) performing a chemical mechanical polish (CMP) process on the insulating nitride layer to form the structure of FIG. 11. After the formation of insulating gate caps 148, ILD layer 118B can be formed on the structure of FIG. 11.

Figure 12:
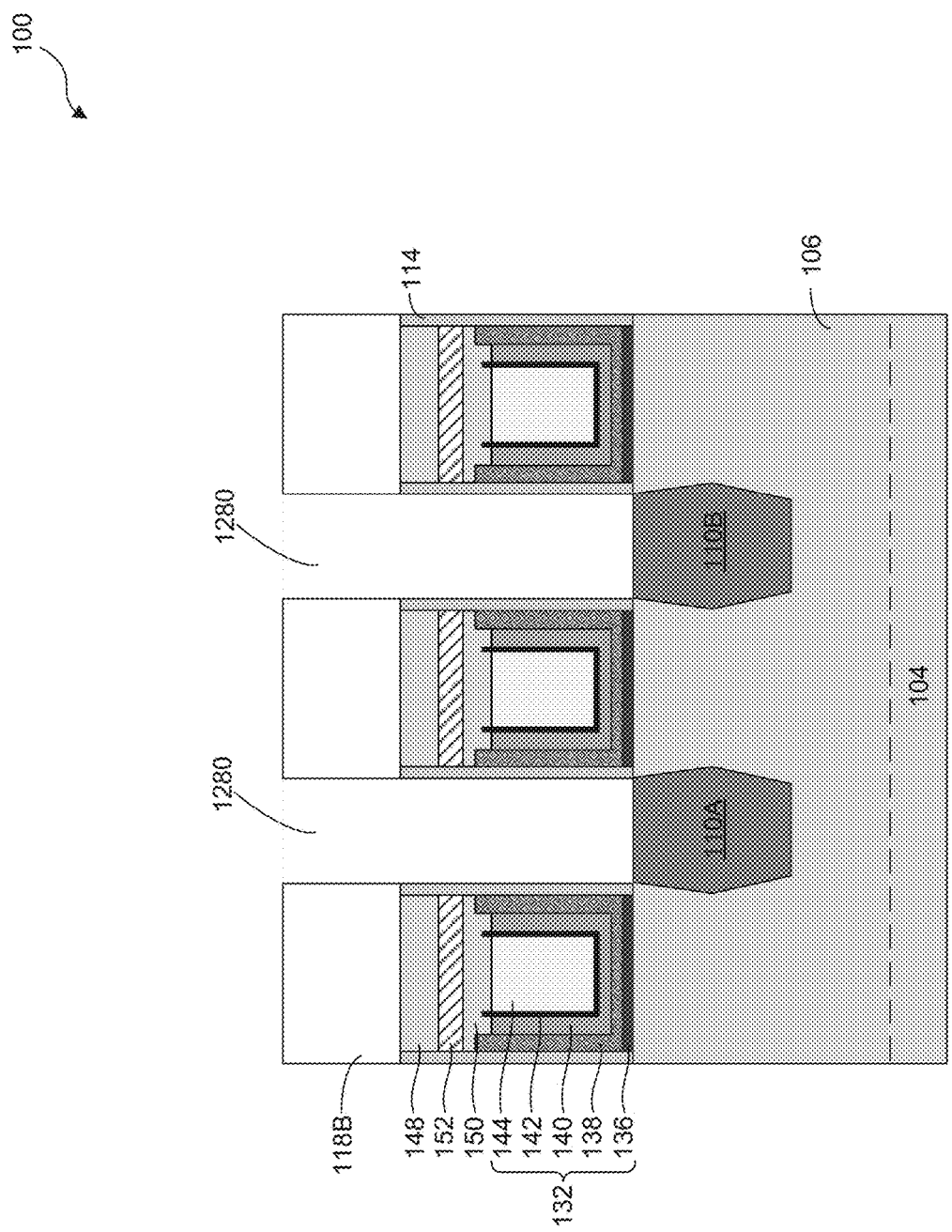
Figure 13:
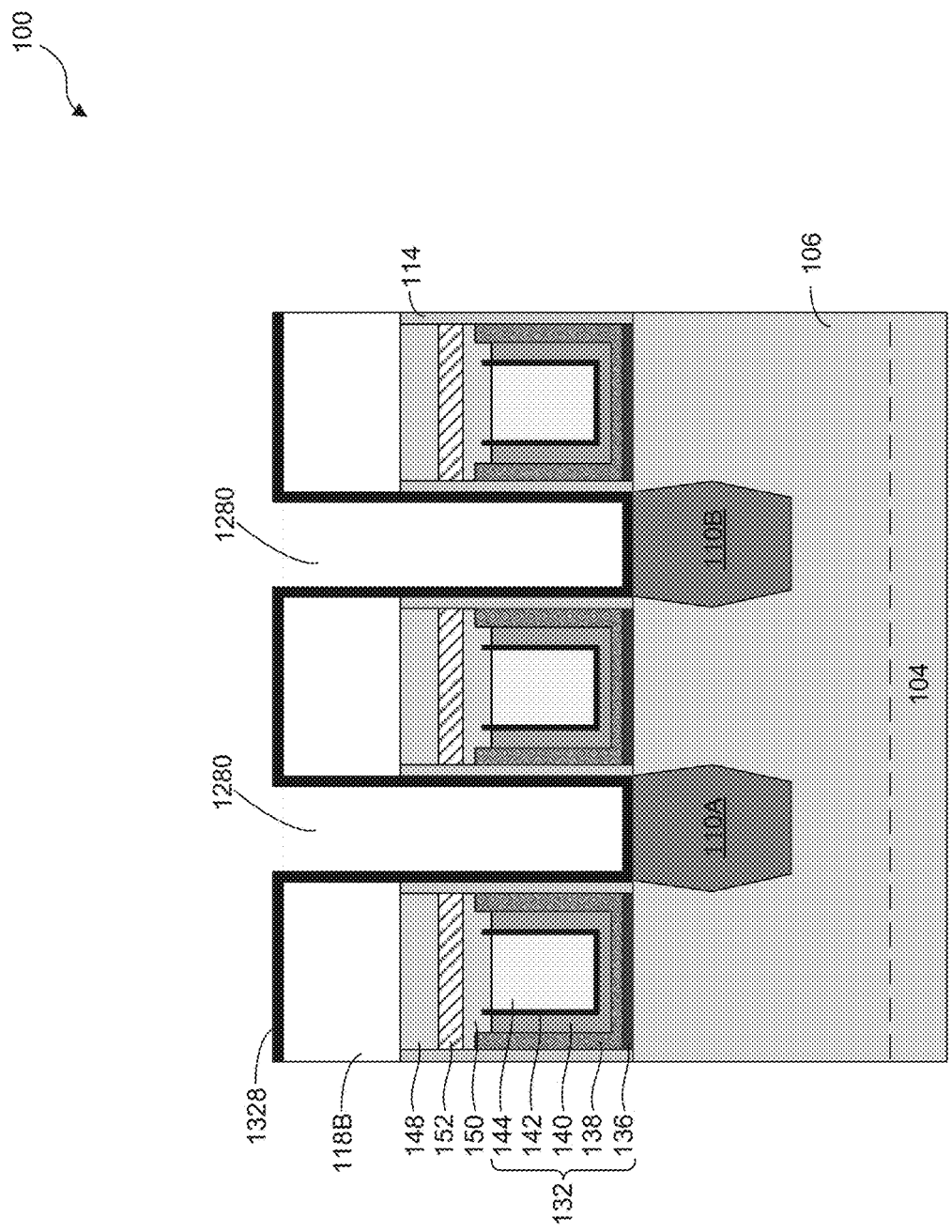
Figure 14:
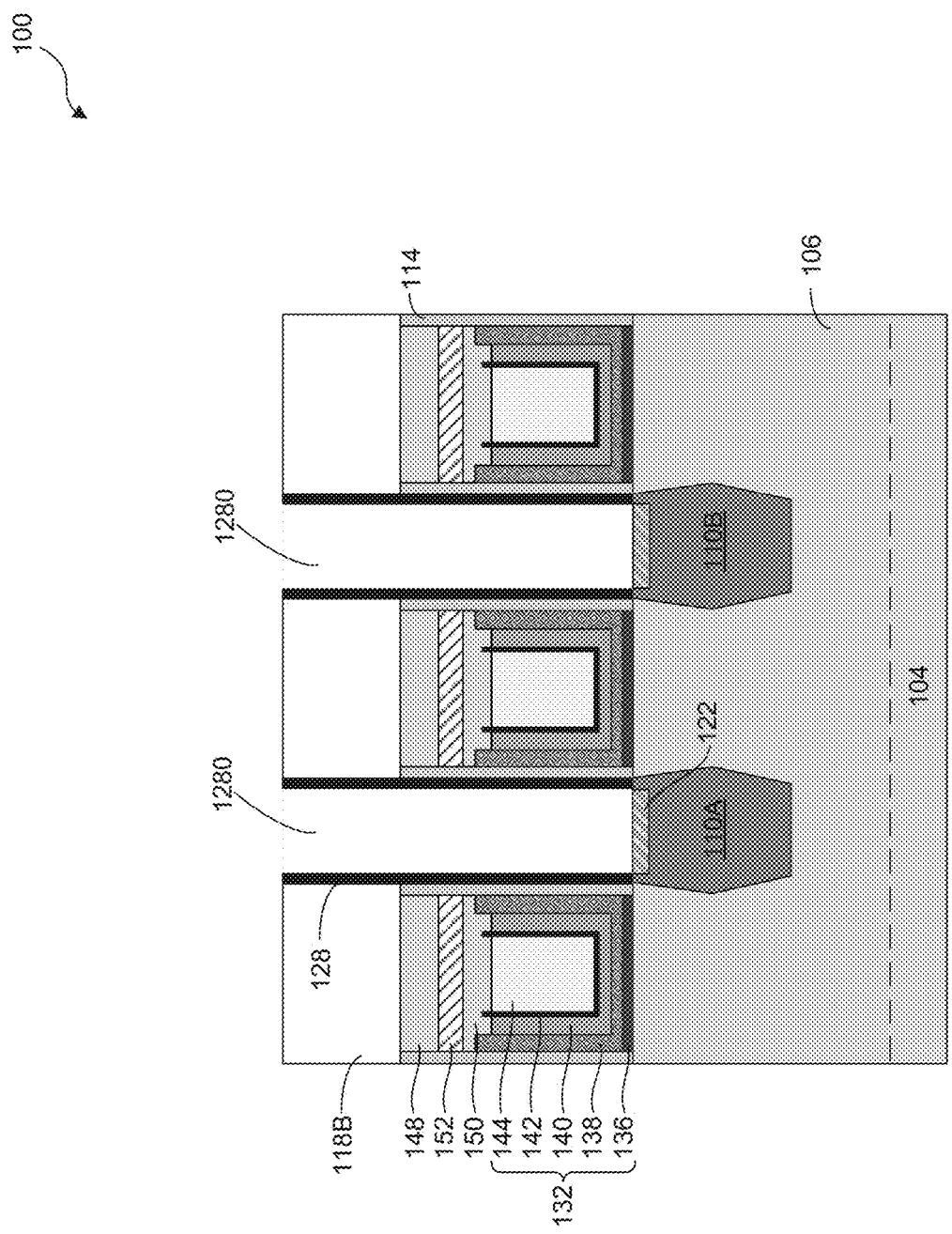
Figure 15:
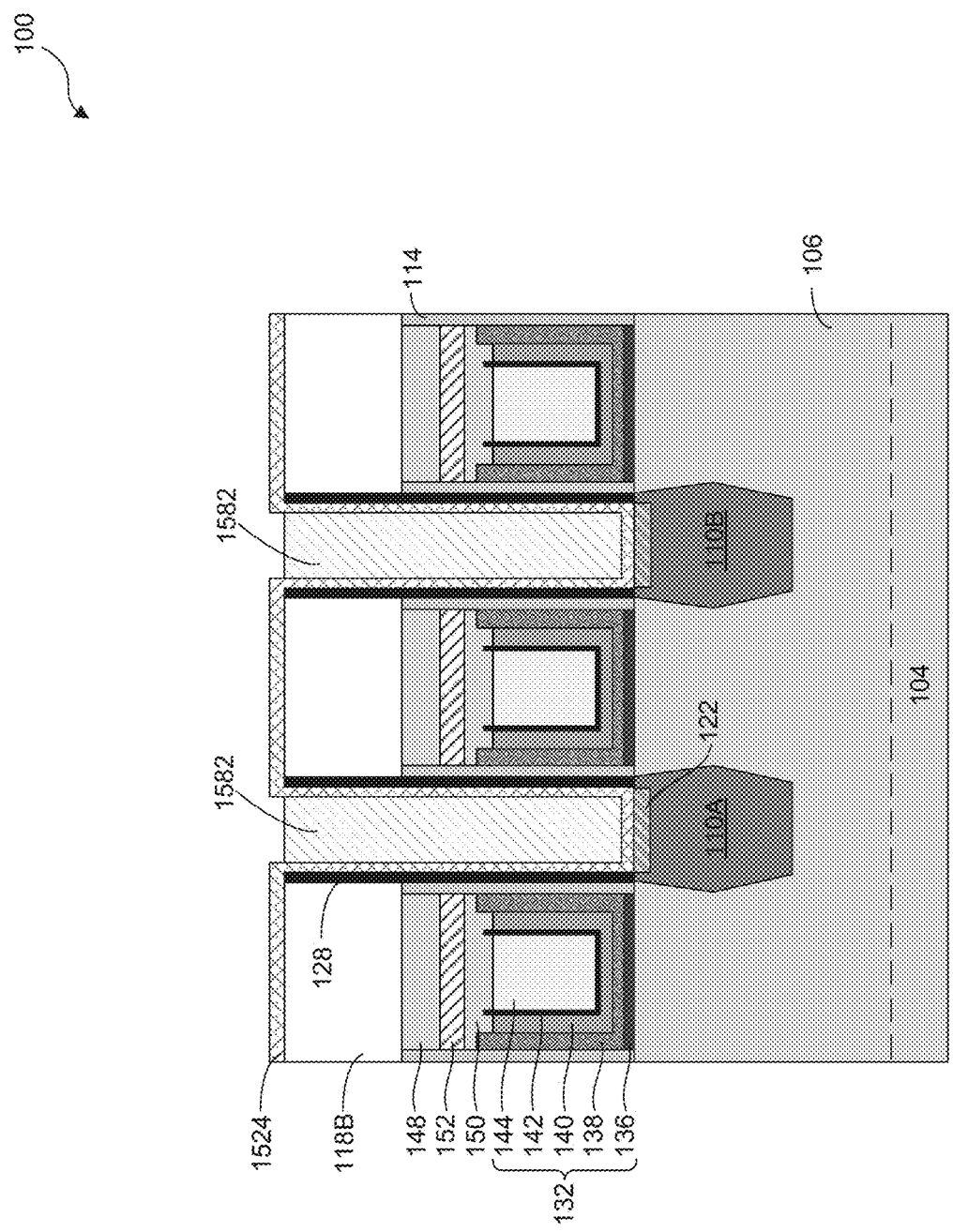
Figure 16:
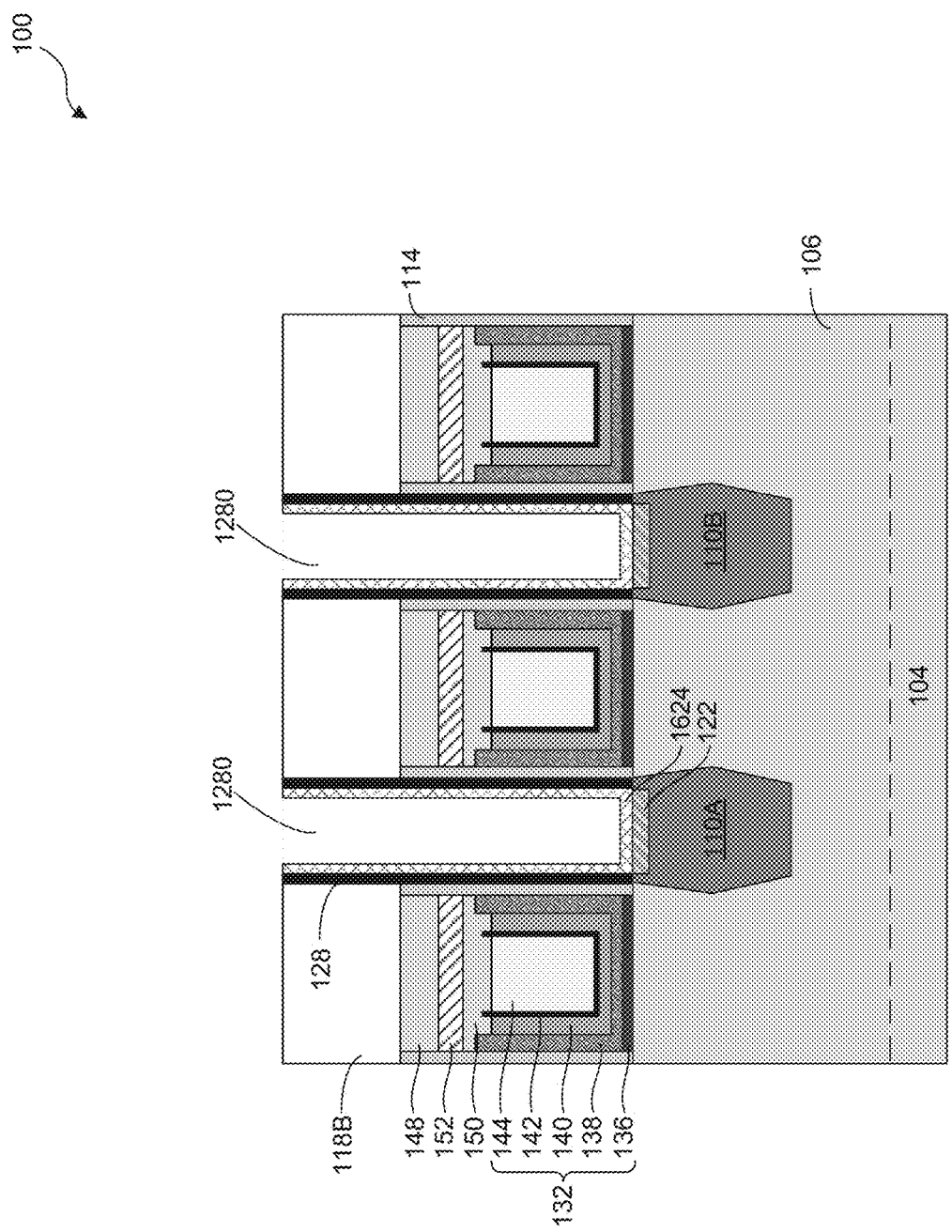
Figure 17:
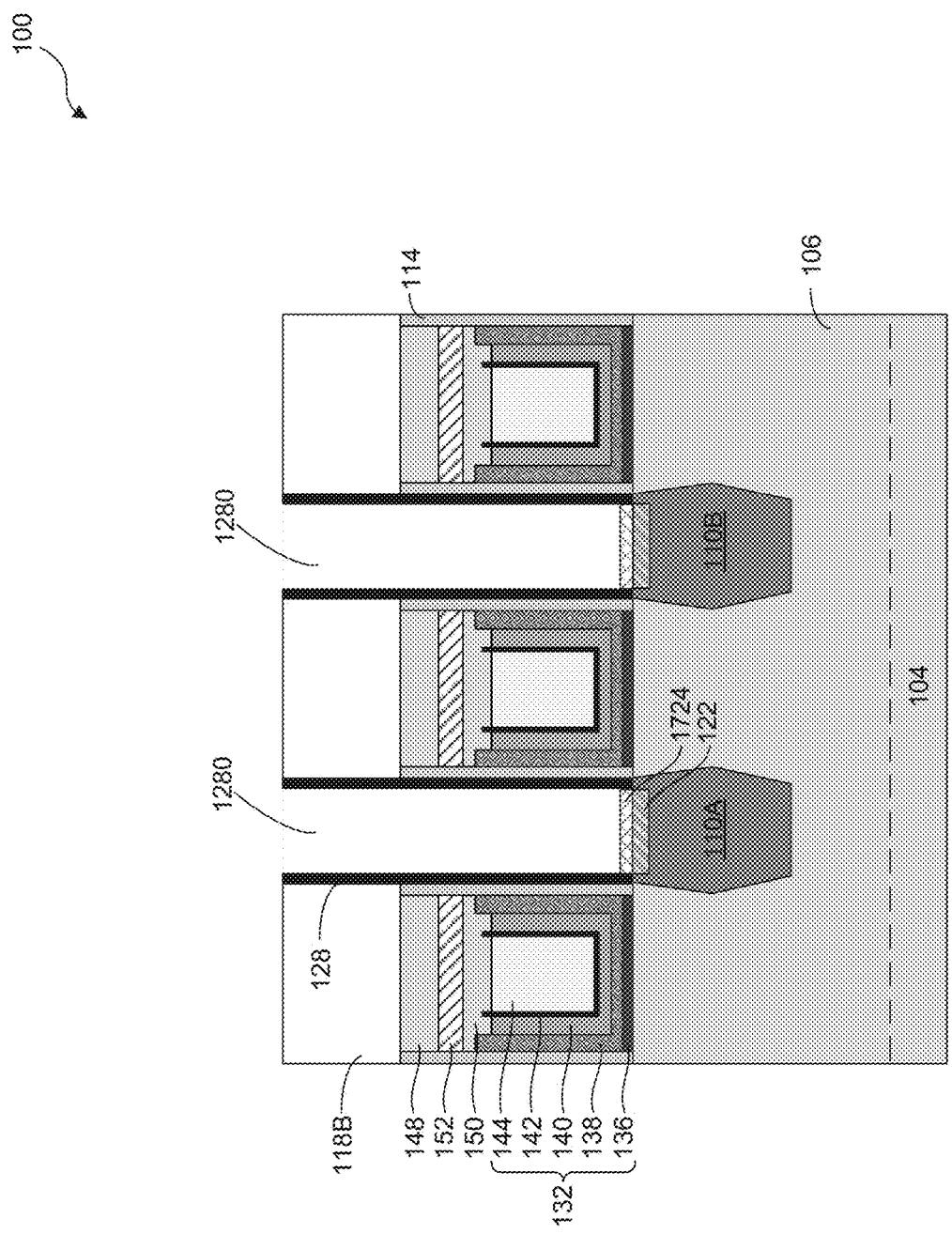
Figure 18:
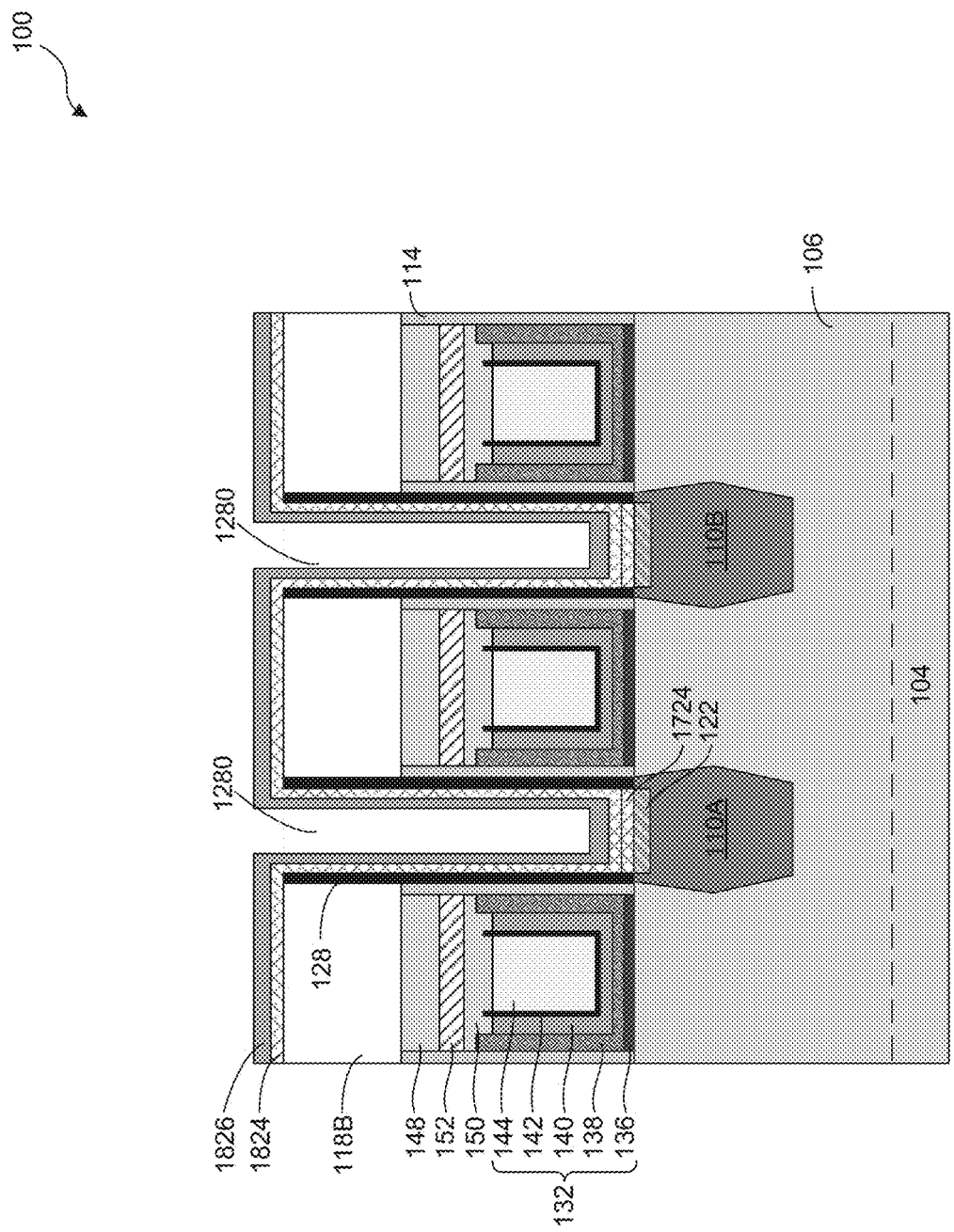
Figure 19:
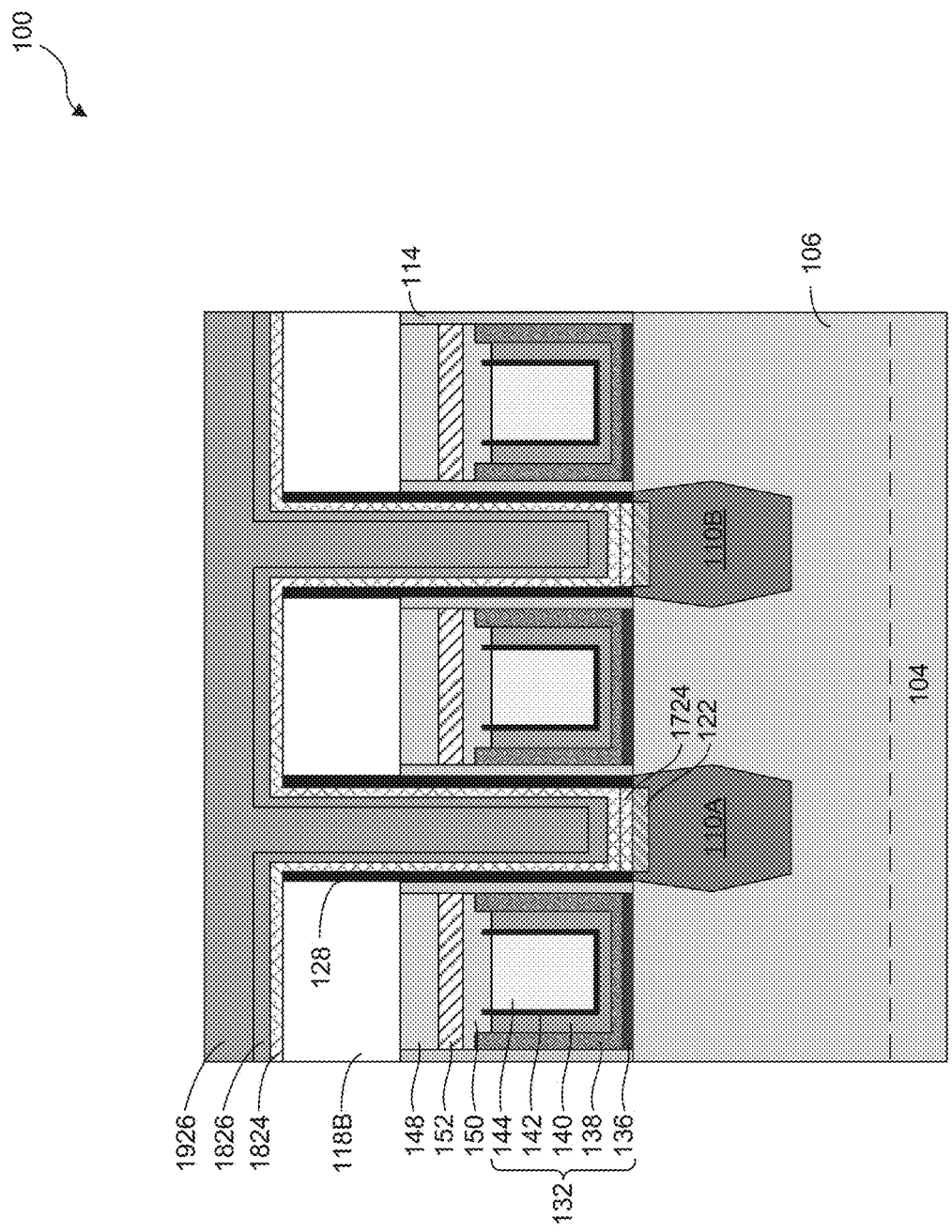
Figure 20:
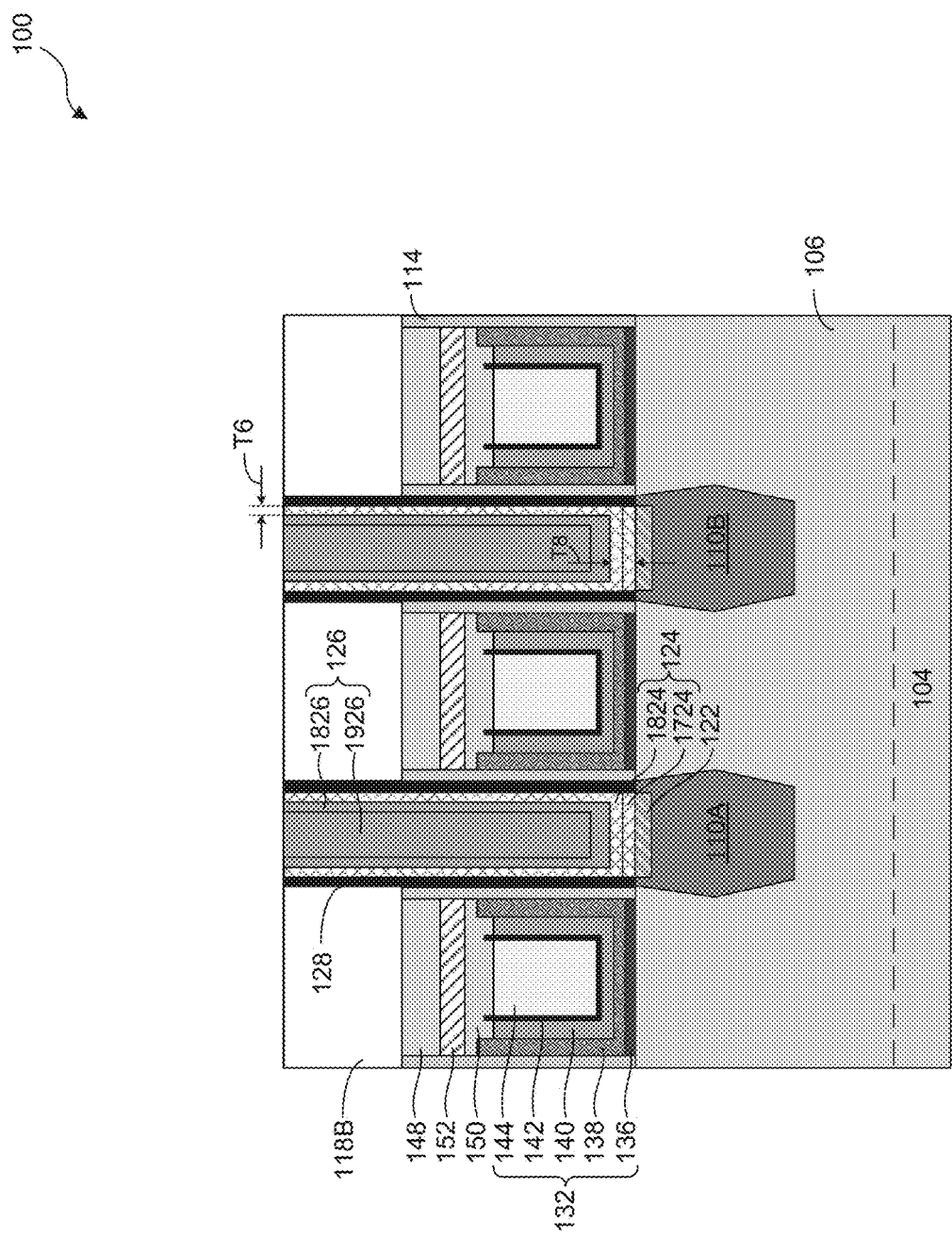

Referring to FIG. 2, in operation 230, S/D contact structures are formed on the S/D regions. For example, as described with reference to FIGS. 12-20, S/D contact structures 120 are formed on S/D regions 110A-110B. The formation of S/D contact structures 120 can include sequential operations of (i) forming contact openings 1280 on S/D regions 110A-110B through ILD layers 118A-118B, as shown in FIG. 12, (ii) depositing a dielectric nitride layer 1328 on the structure of FIG. 12, as shown in FIG. 13, (iii) selectively etching portions of dielectric nitride layer 1328 from the top surfaces of ILD layer 118B and S/D regions 110A-110B to form diffusion barrier layer 128, as shown in FIG. 14, (iv) forming silicide layers 122 within S/D regions 110A-110B, as shown in FIG. 14, (v) depositing a metal layer (not shown) on the structure of FIG. 14, (vi) performing a nitridation process on the deposited metal layer using ammonia ($NH_3$) or nitrogen gas to form metal nitride layer 1524, as shown in FIG. 15, (vii) forming masking layers 1582 (e.g., photoresist layers or anti-reflective coatings) on portions of metal nitride layer 1524 within contact openings 1280 and with the top surfaces substantially coplanar with the top surfaces of ILD layer 118B, as shown in FIG. 15, (viii) etching portions of metal nitride layer 1524 from the top surfaces of ILD layer 118B to form metal nitride layers 1624, as shown in FIG. 16, (ix) removing masking layers 1582, as shown in FIG. 16, (ix) selectively etching sidewall portions of metal nitride layers 1624 to form metal nitride layers 1724, as shown in FIG. 17, using an ALE process similar to that described in operation 215, (x) performing a cleaning process (e.g., fluorine-based dry etching process) on the structure of FIG. 17 to remove native oxides from the top surfaces of metal nitride layers 1724, (xi) depositing a metal nitride layer 1824 on the cleaned structure of FIG. 17, as shown in FIG. 18, (xii) depositing a metal layer 1826 on metal nitride layer 1824, as shown in FIG. 18, (xiii) depositing a metal layer 1926 on the structure of FIG. 18 to form the structure of FIG. 19, and (xiv) performing a CMP process on the structure of FIG. 19 to form adhesion layers 124 and contact plugs 126, as shown in FIG. 20. Adhesion layers 124 are formed with dual metal nitride layers 1724 and 1824 to form base portions, with thicknesses T8 on silicide layers 122, thicker than sidewall portions with thicknesses T9, as shown in FIG. 20.

In some embodiments, metal nitride layer 1824 can be deposited with a thickness of about 1 nm to about 2 nm using an ALD process at a temperature of about 400° C. to about 450° C. Other thicknesses and temperature ranges are within the scope of the disclosure. In some embodiments, metal nitride layer 1824 can include a metal similar to or different from the metal included in metal nitride layer 1724. In some embodiments, metal layer 1826 can include a metal similar to or different from the metal included in metal layer 1926. After the formation of S/D contact structures 120, ESL 117B can be formed on the structure of FIG. 120 and ILD layer 118C can be formed on ESL 117B.

Figure 21:
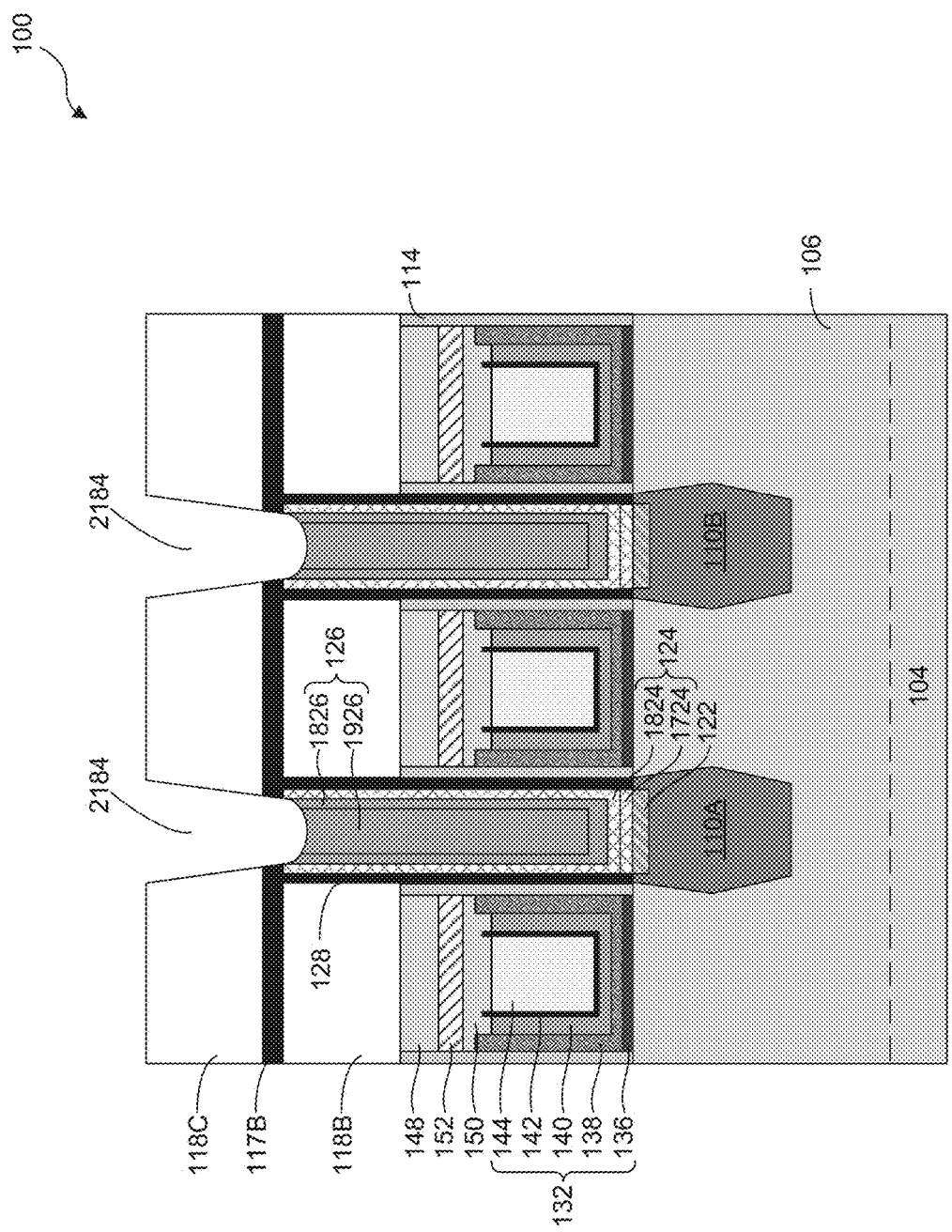
Figure 22:
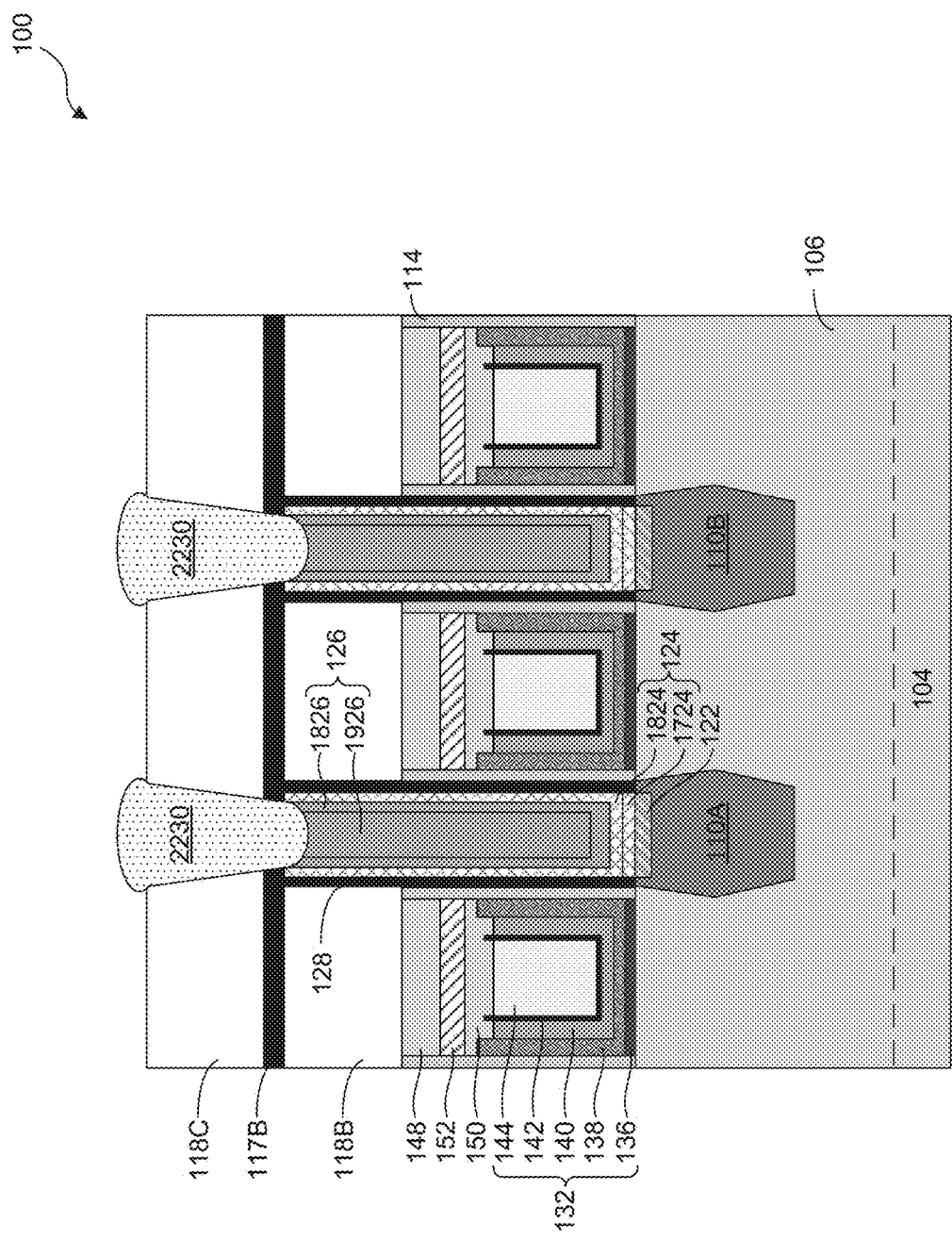
Figure 23:
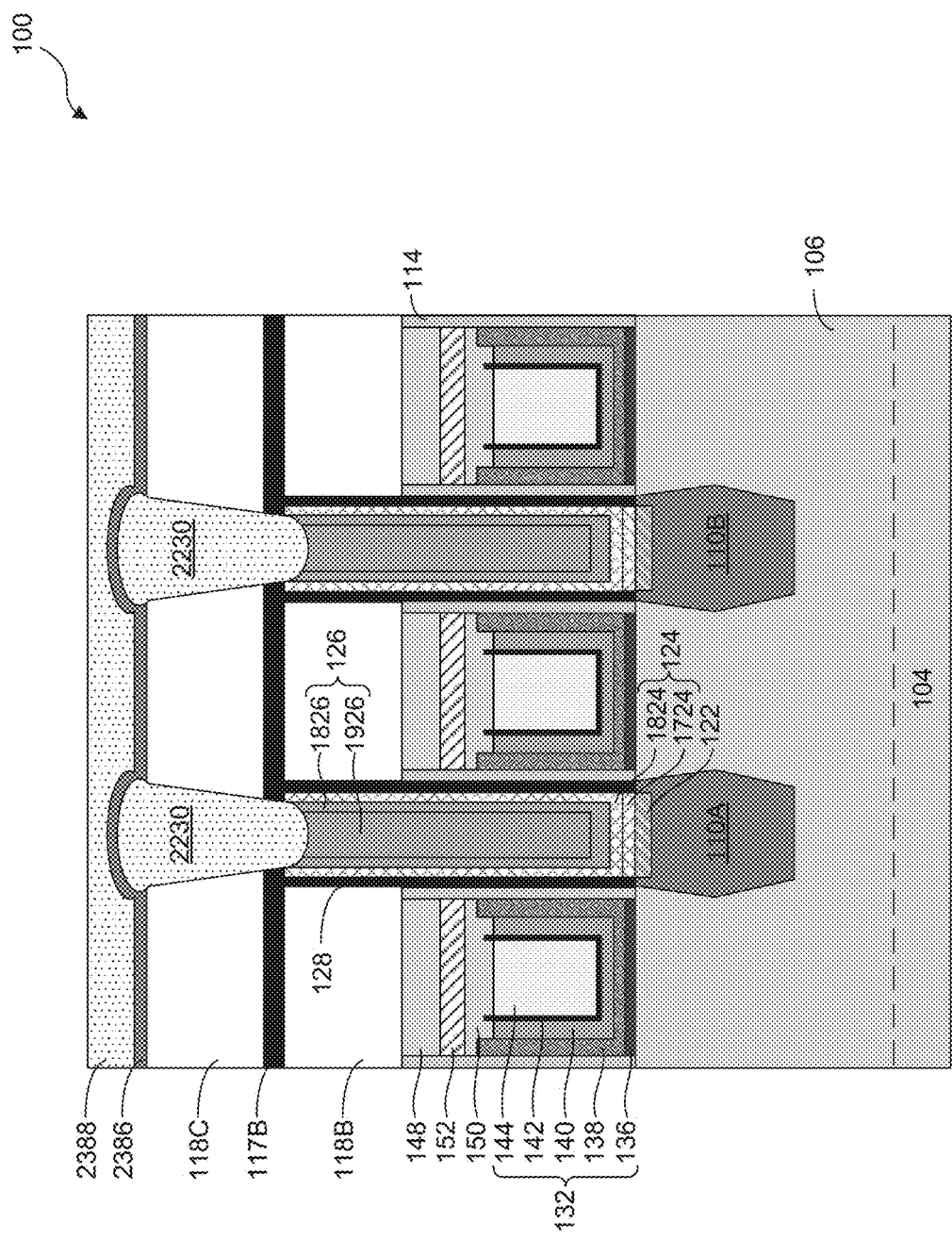
Figure 24:
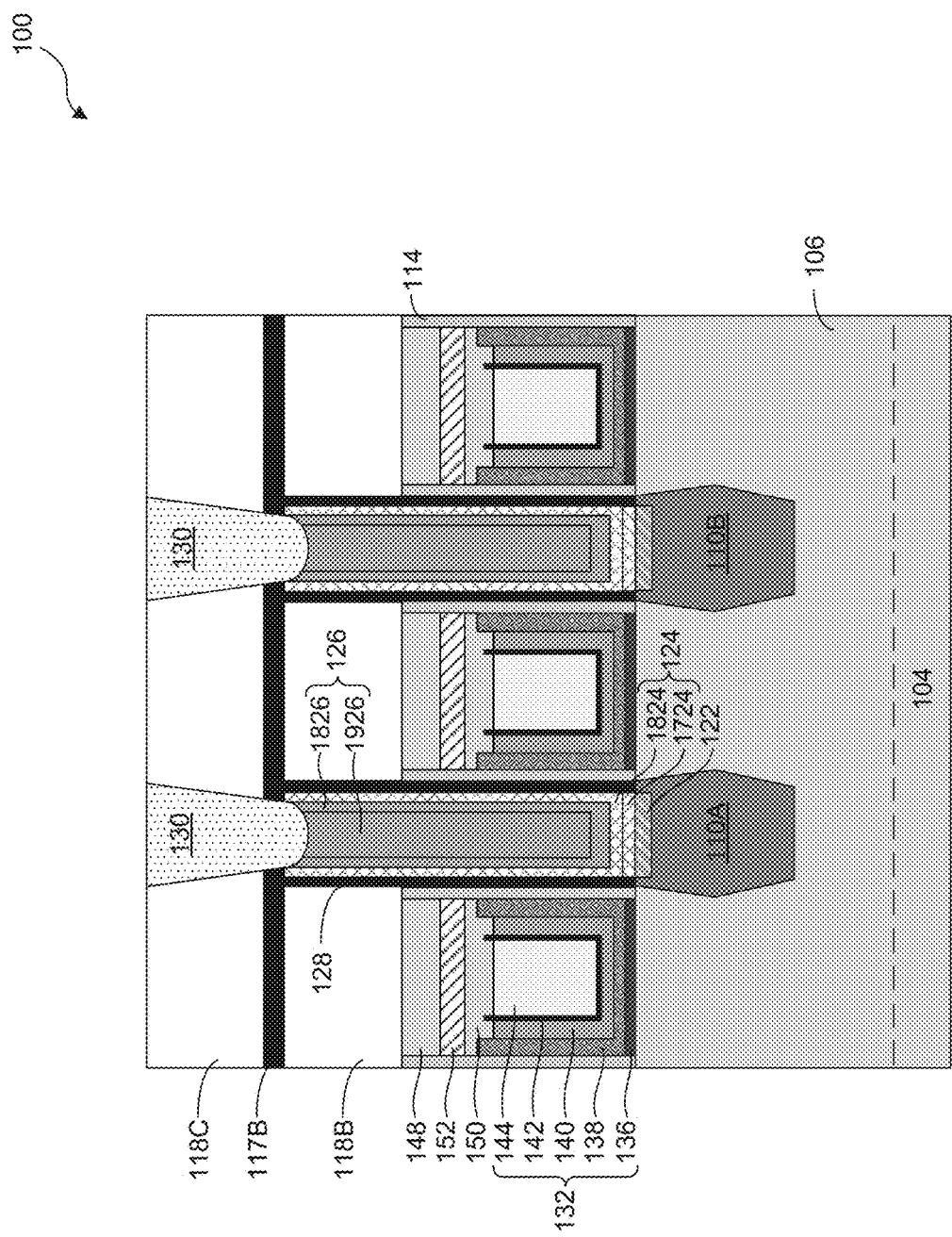
Figure 25:
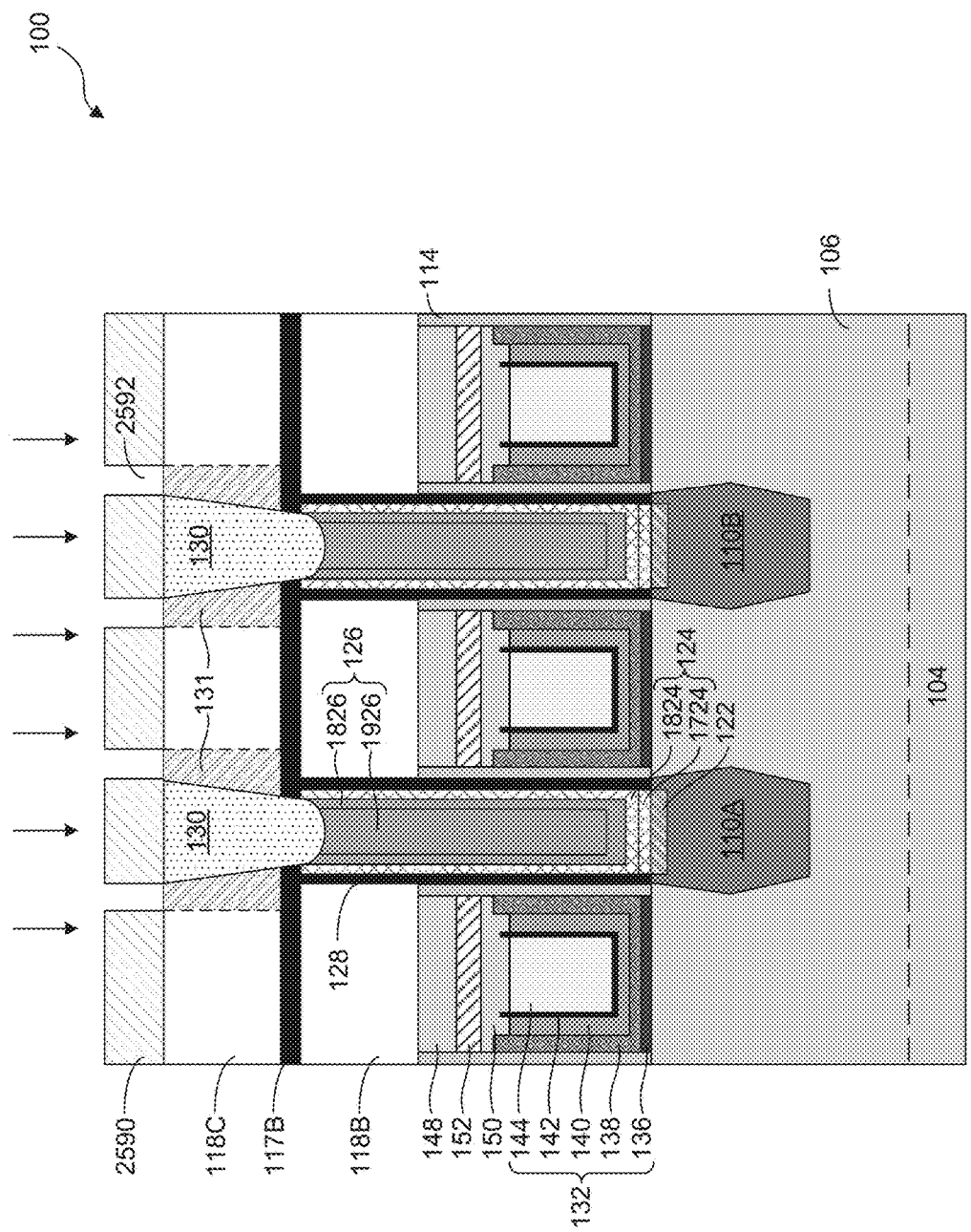

Referring to FIG. 2, in operation 235, vias are formed on the S/D contact structures. For example, as described with reference to FIGS. 21-25, vias 130 are formed on S/D contact structures 120. The formation of vias 130 can include sequential operations of (i) forming via openings 2184 on contact plugs 126 using an isotropic etching process, as shown in FIG. 21, (ii) depositing metal layers 2230 within via openings 2184, as shown in FIG. 22, (iii) depositing a glue layer 2386 substantially conformally on the structure of FIG. 22, as shown in FIG. 23, (iv) depositing a metal layer 2388 on glue layer 2386, as shown in FIG. 23, (v) performing a CMP process on the structure of FIG. 23 to form vias 130, as shown in FIG. 24, (vi) forming a patterned masking layer 2590 (e.g., a photoresist layer) on the structure of FIG. 24, as shown in FIG. 25, (vii) forming doped regions 131 by implanting dopants through openings 2592 in masking layer 2590, as shown in FIG. 25, and (vii) removing patterned masking layer 2590.

In some embodiments, metal layers 2230 can be deposited using a bottom-up deposition process with $WF_6$ and $H_2$ precursor gases at a temperature ranging from about 250° C. to about 300° C. and at a pressure ranging from about 2 torr to about 10 torr. Other thicknesses, temperatures, and pressure ranges are within the scope of the disclosure. Glue layer 2386 can be deposited for promoting deposition of metal layer 2388 with thickness ranging from about 3 nm to about 5 nm using $WF_6$ and $H_2$ precursor gases at a temperature ranging from about 250° C. to about 300° C. and at a pressure ranging from about 2 torr to about 10 torr. Other thicknesses, temperatures, and pressure ranges are within the scope of the disclosure.

Figure 26:
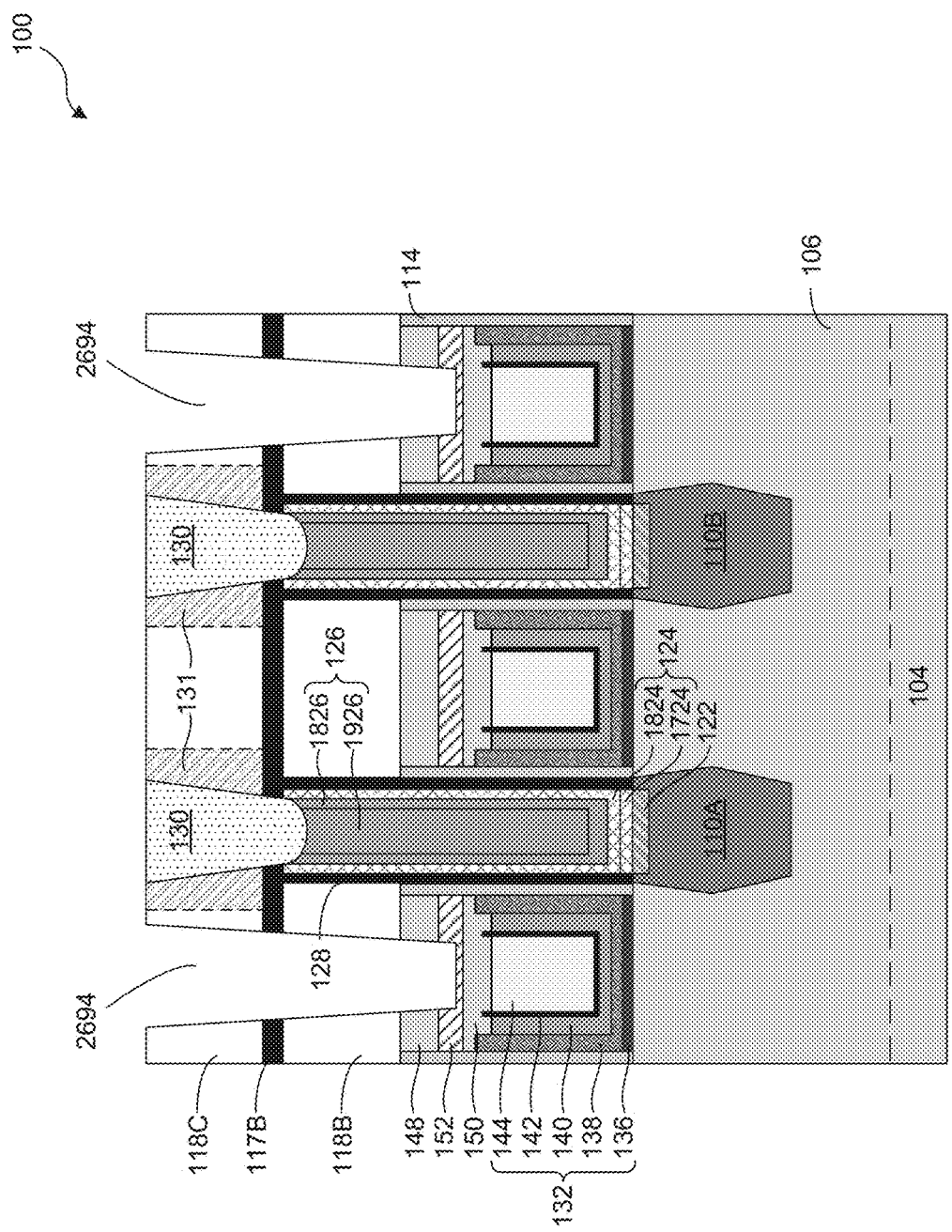
Figure 27:
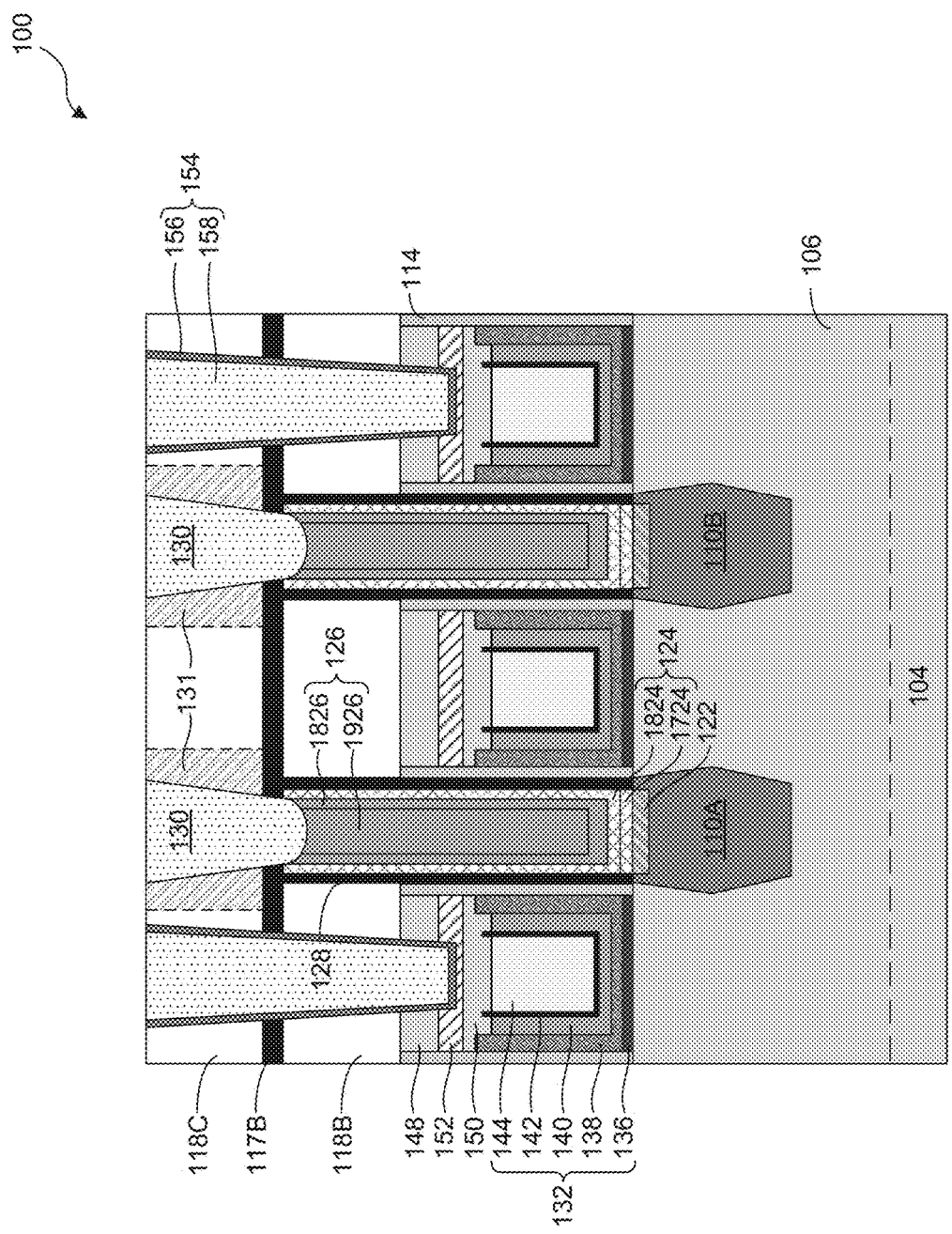

Referring to FIG. 2, in operation 240, gate contact structures are formed on the gate structures. For example, as described with reference to FIGS. 26-27, gate contact structures 154 are formed on gate structures 112A-112B. The formation of gate contact structures 154 can include sequential operations of (i) forming contact openings 2694 extending into ESLs 152, as shown in FIG. 26, (ii) depositing the material of liners 156 on the structure of FIG. 26, (iii) depositing the material of contact plugs 158 on the deposited material of liners 156, and (iv) performing a CMP process on the deposited materials of liners 156 and contact plugs 158 to form liners 156 and contact plugs 158, as shown in FIG. 27.

Figure 28:
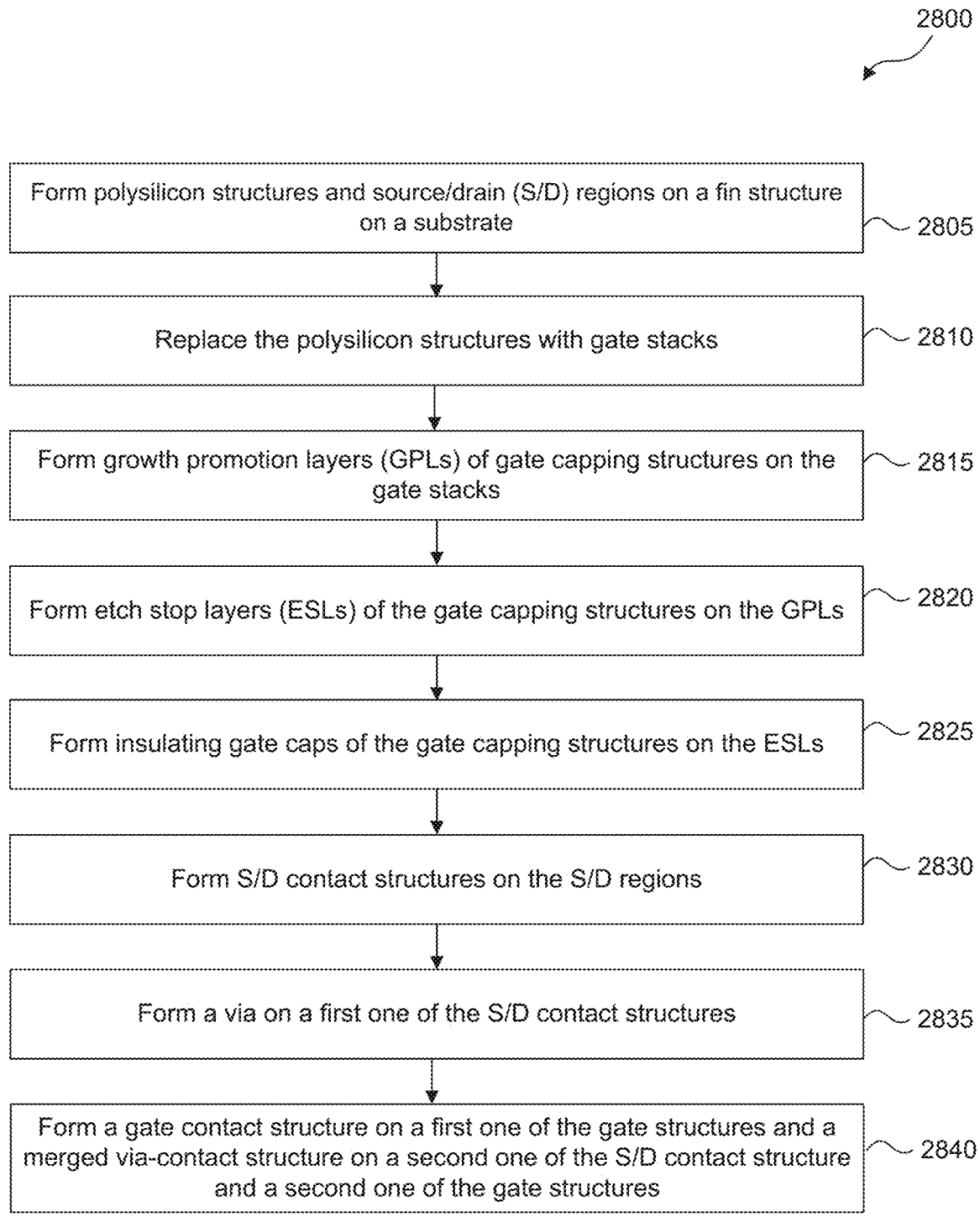
FIG. 28 is a flow diagram of a method for fabricating a semiconductor device with multi-layered gate capping structures, in accordance with some embodiments.

FIG. 28 is a flow diagram of an example method 2800 for fabricating FET 100 with cross-sectional view shown in FIG. 1D, according to some embodiments. For illustrative purposes, the operations illustrated in FIG. 28 will be described with reference to the example fabrication process for fabricating FET 100 as illustrated in FIGS. 3-25 and FIGS. 29-31. FIGS. 3-25 and 29-31 are cross-sectional views of FET 100 along line A-A of FIG. 1A at various stages of fabrication, according to some embodiments. Operations can be performed in a different order or not performed depending on specific applications. It should be noted that method 2800 may not produce a complete FET 100. Accordingly, it is understood that additional processes can be provided before, during, and after method 2800, and that some other processes may only be briefly described herein. Elements in FIGS. 3-25 and FIGS. 29-31 with the same annotations as elements in FIGS. 1A-1E are described above.

Referring to FIG. 28, operations 2805-2830 are similar to operations 205-230 of FIG. 2. After operation 2830, a structure similar to the structure of FIG. 20 is formed.

Figure 29:
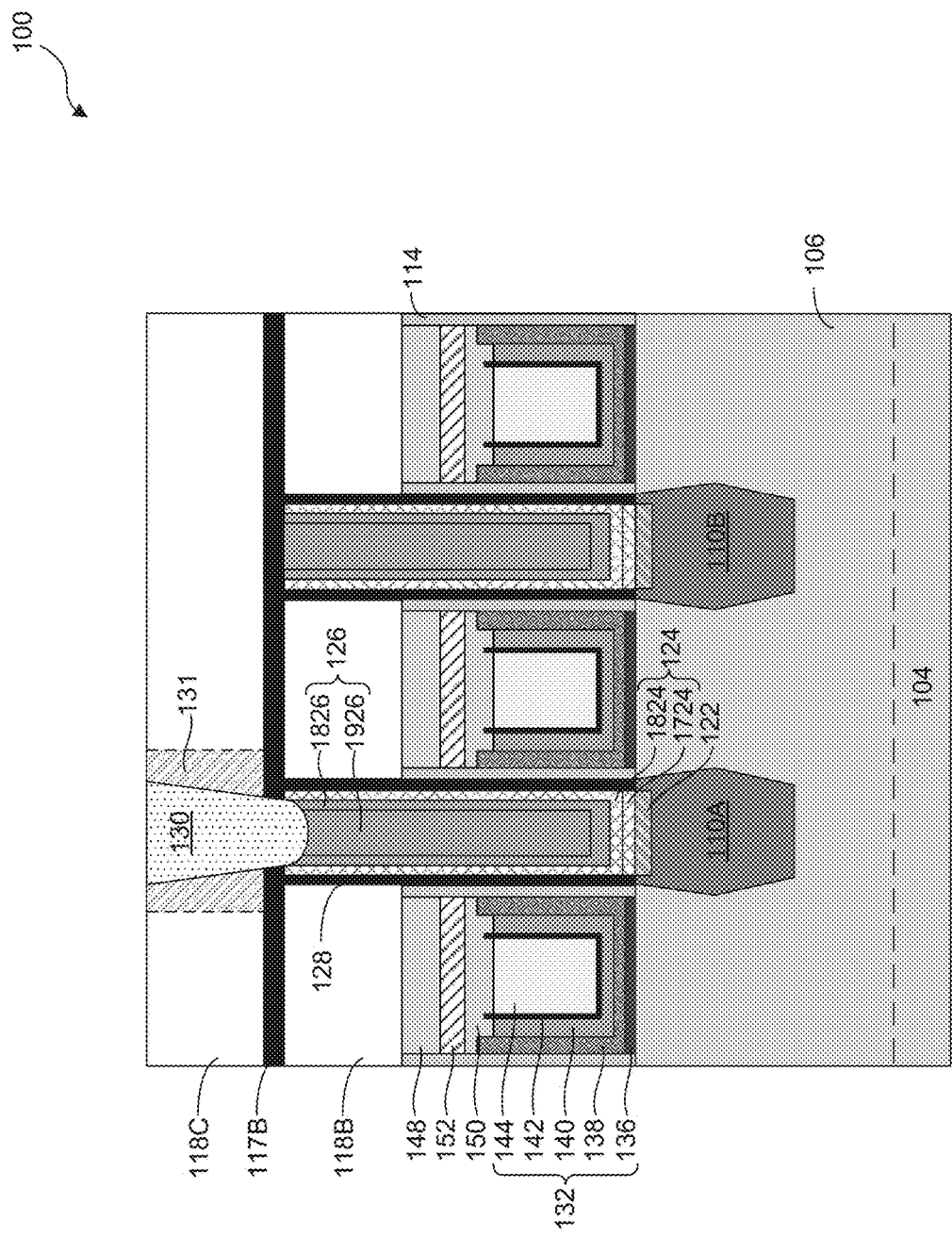
FIGS. 29-31 illustrate cross-sectional views of a semiconductor device with multi-layered gate capping structures at various stages of its fabrication process, in accordance with some embodiments.

Referring to FIG. 28, in operation 2835, a via is formed on a first one of the S/D contact structures. For example, as shown in FIG. 29, via 130 with surrounding doped region 131 is formed on S/D contact structure 120, which is formed on S/D region 110A. Via 130 and doped region 131 can be formed in an operation similar to operation 235.

Figure 30:
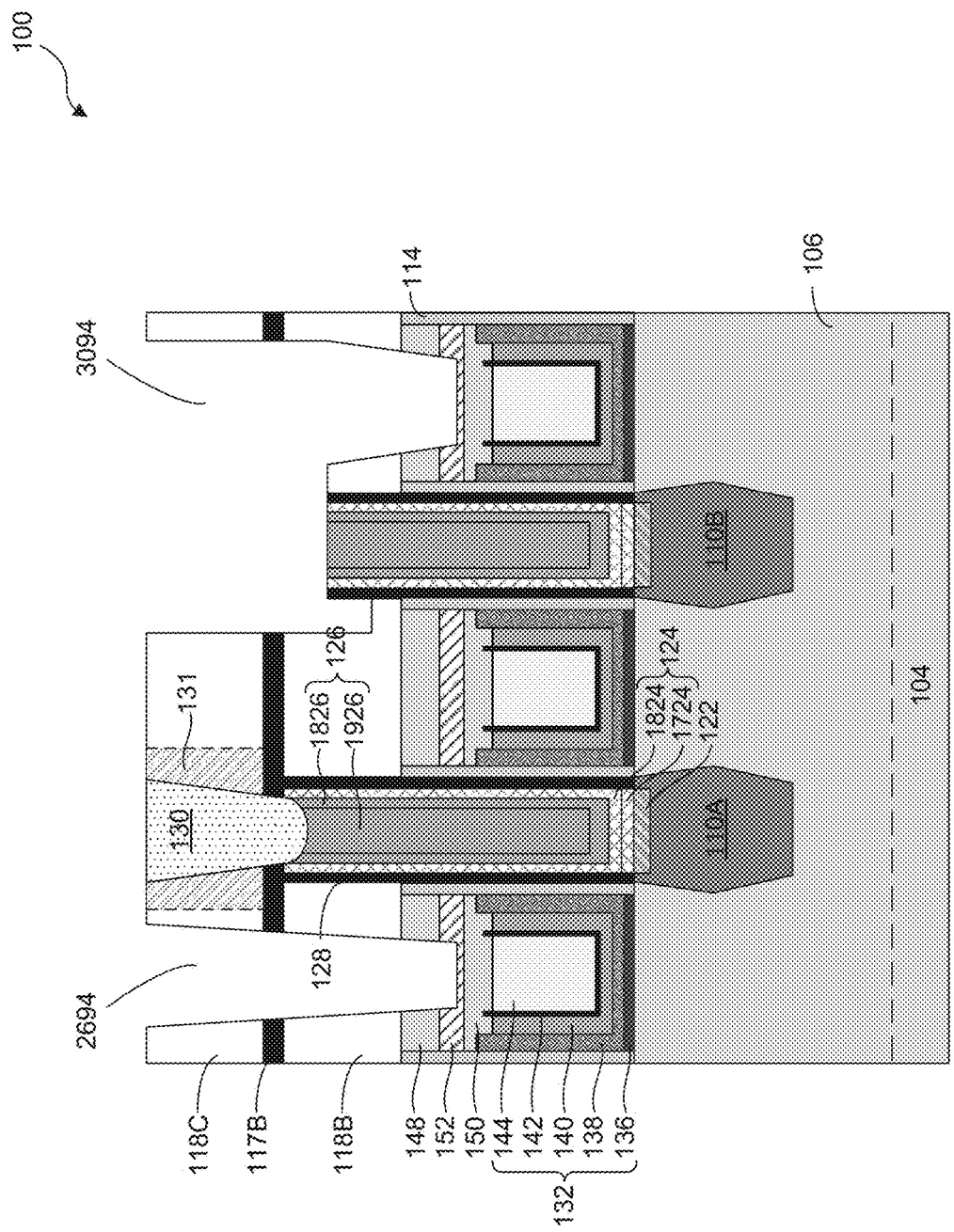
Figure 31:
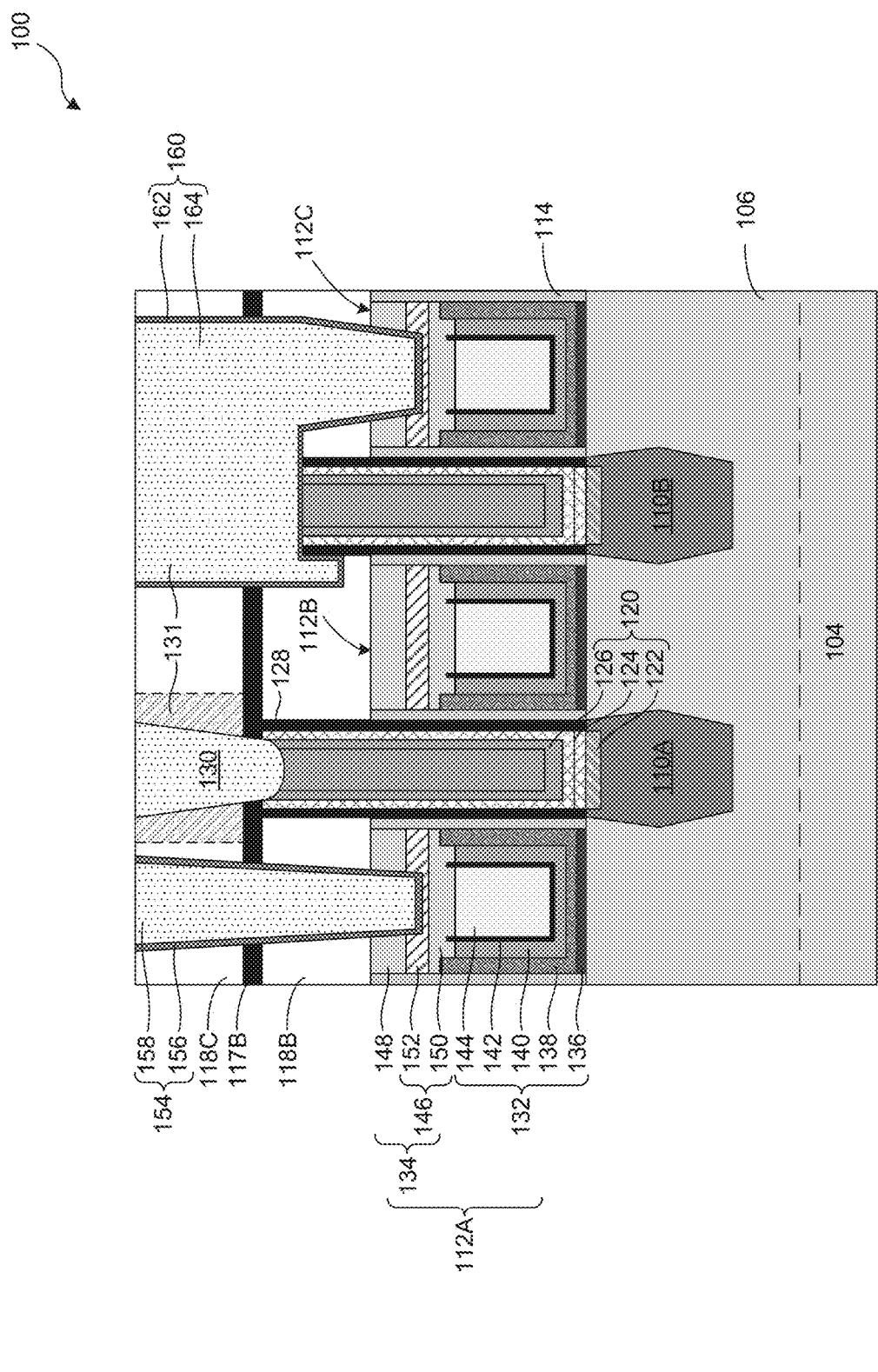

Referring to FIG. 28, in operation 2840, a gate contact structure is formed on a first one of the gate structures and a merged via-contact structure is formed on a second one of the S/D contact structures and on a second one of the gate structures. For example, as described with reference to FIGS. 30-31, gate contact structure 154 and merged via-contact structure 160 are formed at the same time. The formation of gate contact structure 154 and merged via-contact structure 160 can include sequential operations of (i) forming contact openings 2694 and 3094, as shown in FIG. 30, (ii) depositing the material of liners 156 and 162 on the structure of FIG. 30, (iii) depositing the material of contact plugs 158 and 164 on the deposited material of liners 156 and 162, and (iv) performing a CMP process on the deposited materials of liners 156 and 162, and contact plugs 158 and 164 to form liners 156 and 162, and contact plugs 158 and 164, as shown in FIG. 31.

The present disclosure provides example semiconductor devices (e.g., finFETs, gate-all-around (GAA) FETs, and/or MOSFETs) with gate capping structures (in gate structures). Further, the present disclosure provides example methods of forming such semiconductor devices with reduced contact resistance between the gate structures and gate contact structures, which are formed through the gate capping structures. The gate capping structures provide a conductive interface between the gate structures and the gate contact structures, while protecting the integrity of the gate structures during the fabrication of the semiconductor devices.

In some embodiments, each of the gate structure can include a gate stack with a high-k gate dielectric layer, a work function metal (WFM) layer, an oxygen barrier layer, and a gate metal fill layer. In some embodiments, the gate capping structure can include a conductive gate cap disposed on the gate stack and an insulating gate cap disposed on the conductive gate cap. The conductive gate cap provides a conductive interface between the gate stack and the gate contact structure to electrically connect the gate stack to the gate contact structure without forming the gate contact structure directly on or within the gate stack. The gate contact structure is not formed directly on or within the gate stack to prevent contamination of the gate stack by any of the processing materials used in the formation of the gate contact structure. Contamination of the gate stack can lead to the degradation of device performance. Thus, with the use of the conductive gate cap, the gate stack can be electrically connected to the gate contact structure without compromising the integrity of the gate structure.

In some embodiments, the insulating gate cap protects the underlying conductive gate cap and the gate stack from structural and/or compositional degradation during subsequent process of the semiconductor device. In some embodiments, the conductive gate cap can include a growth promotion layer (GPL) disposed on the gate stack and an etch stop layer (ESL) disposed on the GPL. The GPL and ESL can include conductive materials different from each other. The GPL provides a surface favorable for the bottom up deposition of the ESL in addition to providing the conductive interface between the gate stack and the gate contact structure. Without the GPL, the ESL may not selectively deposit on the gate stack and may deposit on FET structures that can electrically short with subsequently-formed adjacent structures, such as source/drain (S/D) contact structures. The GPL can include a material for which the ESL has a deposition selectivity that is higher than the deposition selectivity for one or more of the materials (e.g., dielectric materials of the high-k gate dielectric layer and oxygen barrier) of the gate stack. In other words, the ESL can deposit at a higher rate on the GPL than on the gate stack. The ESL controls the depth profile of the gate contact structure and prevents the gate contact structure from extending into the gate stack in addition to providing the conductive interface between the gate stack and the gate contact structure.

In some embodiments, a semiconductor device includes a substrate, a fin structure disposed on the substrate, a source/ drain (S/D) region disposed on the fin structure, and a gate structure disposed on the fin structure adjacent to the S/D region. The gate structure includes a gate stack disposed on the fin structure and a gate capping structure disposed on the gate stack. The gate capping structure includes a conductive gate cap disposed on the gate stack and an insulating gate cap disposed on the conductive gate cap. The semiconductor device further includes a first contact structure disposed over the gate stack. A portion of the first contact structure is disposed within the gate capping structure and is separated from the gate stack by a portion of the conductive gate cap.

In some embodiments, a semiconductor device includes a substrate, a fin structure disposed on the substrate, first and second source/drain (S/D) regions disposed on the fin structure, first and second S/D contact structures disposed on the first and second S/D regions, respectively, and first and second gate structures disposed on the fin structure. Each of the first and second gate structures includes a gate stack and a gate capping structure that includes a conductive gate cap and an insulating gate cap. The semiconductor device further includes a merged via-contact structure disposed on the first S/D contact structure and over the gate stack of the first gate structure. A portion of the merged via-contact structure is disposed within the gate capping structure of the first gate structure.

In some embodiments, a method includes forming a fin structure on a substrate, forming a source/drain (S/D) region on the fin structure, forming a polysilicon structure on the fin structure, replacing the polysilicon structure with a gate stack, forming a conductive gate cap on the gate stack, forming an insulating gate cap on the gate stack, forming a contact structure on the S/D region, and forming a via on the contact structure, wherein the forming the via comprises forming a doped region surrounding the via.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
  a substrate;
  a fin structure disposed on the substrate;
  a source/drain (S/D) region disposed on the fin structure;
  a gate structure disposed on the fin structure adjacent to the S/D region,
    wherein the gate structure comprises a gate stack disposed on the fin structure and a gate capping structure disposed on the gate stack,
    wherein the gate capping structure comprises a conductive gate cap disposed on the gate stack and an insulating gate cap disposed on the conductive gate cap, and
    wherein the conductive gate cap comprises a stack of conductive layers with materials different from each other; and
  a first contact structure disposed over the gate stack, wherein a portion of the first contact structure is disposed within the gate capping structure and is separated from the gate stack by a portion of the conductive gate cap.

2. The semiconductor device of claim 1, wherein the conductive gate cap comprises a growth promotion layer (GPL) disposed on the gate stack and an etch stop layer (ESL) disposed on the GPL.

3. The semiconductor device of claim 2, wherein the GPL comprises a material for which the ESL has a higher deposition selectivity than for a dielectric material included in the gate stack.

4. The semiconductor device of claim 2, wherein the portion of the first contact structure is disposed within the ESL.

5. The semiconductor device of claim 2, wherein the portion of the first contact structure is separated from the gate stack by the GPL.

6. The semiconductor device of claim 2, wherein the portion of the first contact structure is separated from the GPL by a portion of the ESL.

7. The semiconductor device of claim 1, wherein the conductive gate cap comprises a metal nitride layer disposed on the gate stack and a metallic layer disposed on the metal nitride layer.

8. The semiconductor device of claim 1, wherein the gate stack comprises an oxygen barrier layer that extends into the conductive gate cap.

9. The semiconductor device of claim 1, wherein the conductive gate cap is surrounded by a gate dielectric layer of the gate stack.

10. The semiconductor device of claim 1, further comprising:
  a second contact structure disposed on the S/D region;
  an inter-layer dielectric (ILD) layer disposed on the second contact structure;
  a doped region within the ILD layer; and
  a via disposed within the ILD layer and surrounded by the doped region.

11. The semiconductor device of claim 10, wherein the doped region comprises a first group of semiconductor atoms of a first atomic radius and a second group of semiconductor atoms of a second atomic radius that is larger than the first atomic radius.

12. A semiconductor device, comprising:
  a substrate;
  a fin structure disposed on the substrate; and
  a gate structure, disposed on the fin structure, comprising:
    a dielectric layer;
    a first metal layer disposed on the dielectric layer;
    a barrier layer, disposed on the first metal layer, comprising a semiconductor layer or an oxide layer;
    a second metal layer disposed on the barrier layer; and
    a capping structure, disposed on the second metal layer, comprising a conductive gate cap and an insulating gate cap, wherein the capping structure surrounds a portion of the barrier layer.

13. The semiconductor device of claim 12, wherein the conductive gate cap comprises a metal nitride layer and a metal layer.

14. The semiconductor device of claim 12, wherein the semiconductor layer comprises a silicon layer.

15. The semiconductor device of claim 12, wherein the oxide layer comprises a semiconductor oxide layer or a metal oxide layer.

16. The semiconductor device of claim 12, further comprising a contact structure disposed in the capping structure.

17. A semiconductor device, comprising:
a substrate;
a source/drain (S/D) region disposed on the substrate;
a contact structure disposed on the S/D region;
a via structure disposed on the contact structure;
a doped dielectric region surrounding the via structure;
an undoped dielectric region surrounding the doped dielectric region; and
a gate structure, disposed on the substrate, comprising a conductive gate cap and an insulating gate cap.

18. The semiconductor device of claim 17, further comprising an inter-layer dielectric (ILD) layer disposed on the contact structure, wherein the undoped and doped dielectric regions are disposed in the ILD layer.

19. The semiconductor device of claim 17, wherein the doped dielectric region comprises a first group of semiconductor atoms of a first atomic radius and a second group of semiconductor atoms of a second atomic radius that is larger than the first atomic radius.

20. The semiconductor device of claim 17, wherein the conductive gate cap comprises a titanium nitride layer and a tungsten layer.

\* \* \* \* \*